United States Patent [19]

Hopper et al.

[11] Patent Number: 5,095,441
[45] Date of Patent: Mar. 10, 1992

[54] RULE INFERENCE AND LOCALIZATION DURING SYNTHESIS OF LOGIC CIRCUIT DESIGNS

[75] Inventors: Donald F. Hopper, Northborough; Edward G. Fortmiller, Hudson; Snehamay Kundu, Marlboro; David F. Wall, Worcester, all of Mass.

[73] Assignee: Digital Equipment Corporation, Maynard, Mass.

[21] Appl. No.: 373,085

[22] Filed: Jun. 28, 1989

Related U.S. Application Data

[63] Continuation-in-part of Ser. No. 907,303, Sep. 12, 1986, abandoned.

[51] Int. Cl.$^5$ .............................................. G06F 15/60
[52] U.S. Cl. .................................... 364/489; 364/488; 395/921
[58] Field of Search ............... 364/488, 489, 490, 491, 364/513, 200, 900

[56] References Cited

U.S. PATENT DOCUMENTS

| | | | |
|---|---|---|---|
| 4,510,616 | 4/1985 | Lougheed et al. | 364/490 |
| 4,554,631 | 11/1985 | Reddington | 364/300 |
| 4,613,940 | 9/1986 | Shanton et al. | 364/490 |
| 4,656,603 | 4/1987 | Dunn | 364/490 |
| 4,700,317 | 10/1987 | Watanabe et al. | 364/488 |
| 4,703,435 | 10/1987 | Darringer et al. | 364/489 |
| 4,922,432 | 5/1990 | Kobayashi et al. | 364/490 |
| 4,937,755 | 6/1990 | Yokota et al. | 364/488 |

FOREIGN PATENT DOCUMENTS 1445914  8/1976  United Kingdom ................. 364/490

OTHER PUBLICATIONS

Shinsha et al., "Incremental Logic Synthesis Through Gate Logic Structure Identification", 23rd Design Automation Conference, 1986, pp. 391-397.

Friedman et al., "Quality of Design from an Automatic Logic Generator (ALERT)," IEEE 1970, 7th Design Automation Conf., p. 71.

Friedman et al., "Methods Used in an Automatic Logic Design Generator (ALERT)," IEEE Trans. Computer, vol. C-18, No. 7, Jul. 1969, pp. 593-613.

Darringer et al., "Logic Snythesis Through Local Transformation", IBM Journal, vol. 25, No. 4, Jul. 1981, pp. 272-280.

Darringer et al., "A New Look at Logic Synthesis", IEEE 1980 17th Design Automation Conf., pp. 543-548

"Diverse Design Tools Break into Logic-Synthesis Arena", System Technology, Computer Design, Oct. 15, 1987, pp. 20-21.

Primary Examiner—Parshotam S. Lall
Assistant Examiner—V. N. Trans
Attorney, Agent, or Firm—Finnegan, Henderson, Farabow, Garrett, and Dunner

[57] ABSTRACT

A logic method for accessing rules in a logic circuit synthesis system. Application of rules in a data base results in replacement of one or more model instances with other model instances or in alteration of values associated with the model instances or in the alteration of parameter values in the data base. Model instances are designated as VISIBLE or INVISIBLE, INVISIBLE model instances are ignored during logic circuit synthesis. VISIBLE model instances may be NEW or INACTIVE. All VISIBLE model instances are initially NEW. If no rule asscated with a model instance is TRUE, the model instance becomes INACTIVE. If at least one rule associated with a model instance is TRUE, one or more model instances are replaced and all inserted model instances and model instances directly connected to the inserted model instances become NEW. The number of model instances a rule will replace is called a SIZEWIN value of the rule. During synthesis, each VISIBLE, NEW model instance is paired with its associated rule having the greatest SIZEWIN value. The instance-rule pairs are grouped by SIZEWIN value and the rules of the groups having the greatest SIZEWIN value are tested first. If a model instance has been replaced by a previously executed rule, it is designated as DELETED and its associated, paired rule evaluates to FALSE.

42 Claims, 14 Drawing Sheets

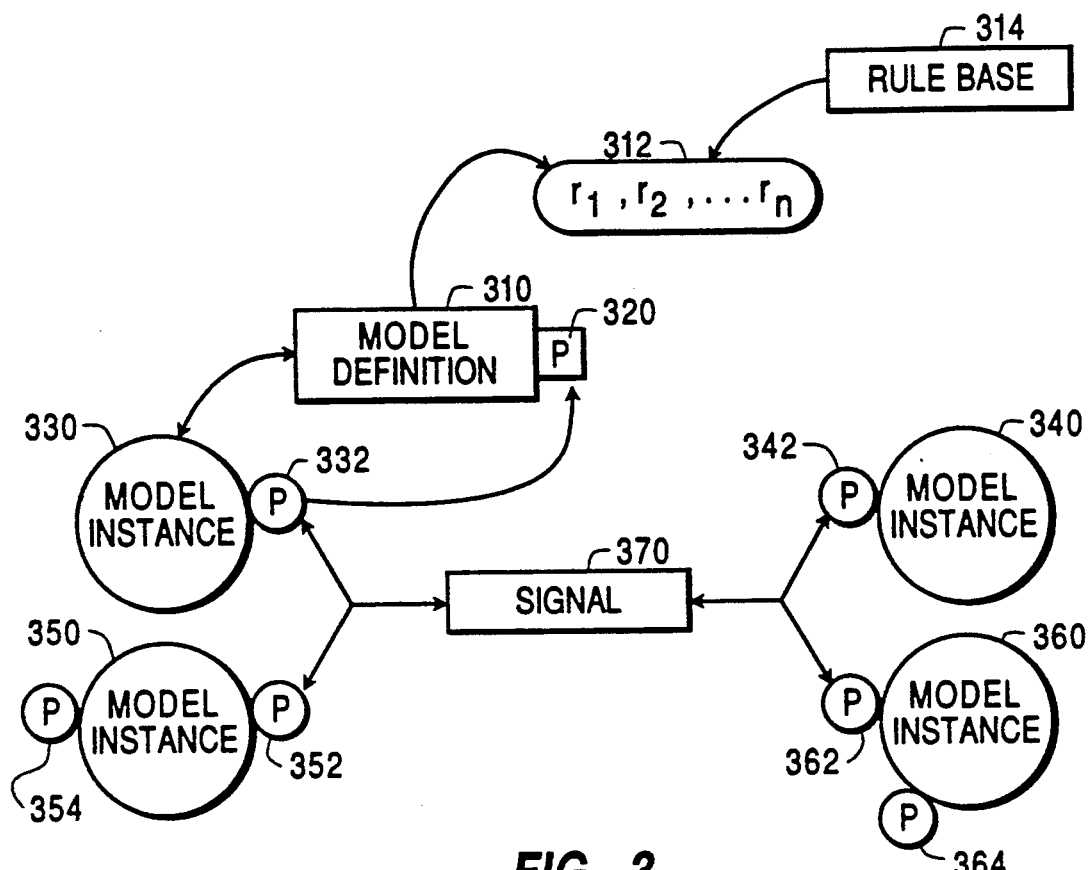
FIG. 3
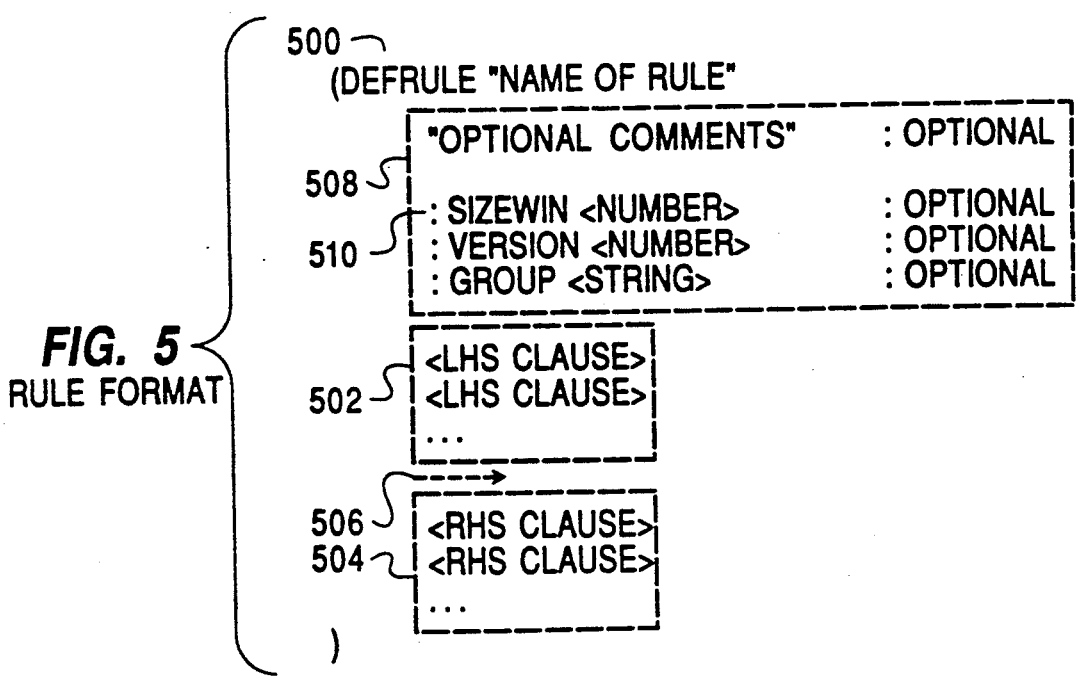
FIG. 5 RULE FORMAT

| | DATA BASE | ANTECEDENT T/F | SIZEWIN GROUPING |
|---|---|---|---|
| MODEL INSTANCE | $i_1 \begin{cases} r_1 \ (5) \\ r_5 \ (2) \\ r_7 \ (1) \end{cases}$ | F<br>T<br>T | SIZEWIN = 5<br>$i_3, r_3$<br>$i_6, r_6$ |
| | $i_2 \begin{cases} r_2 \ (3) \\ r_4 \ (2) \end{cases}$ | T<br>T | SIZEWIN = 4<br>$i_8, r_8$ |
| | $i_3 \ \{ r_3 \ (5)$ | T | SIZEWIN = 3<br>$i_2, r_2$<br>$i_4, r_2$ |
| | $i_4 \begin{cases} r_2 \ (3) \\ r_4 \ (2) \end{cases}$ | T<br>T | SIZEWIN = 2<br>$i_1, r_5$ |
| | $i_5 \begin{cases} r_5 \ (2) \\ r_7 \ (1) \\ r_8 \ (4) \end{cases}$ | F<br>F<br>F | SIZEWIN = 1<br>$i_7, r_7$ |
| | $i_6 \ \{ r_6 \ (5)$ | T | SIZEWIN = 0<br>— |
| | $i_7 \ \{ r_7 \ (1)$ | T | |
| | $i_8 \ \{ r_8 \ (4)$ | T | |

FIG. 9

RULE INFERENCE AND LOCALIZATION DURING SYNTHESIS OF LOGIC CIRCUIT DESIGNS

This application is a continuation-in part of U.S. application Ser. No. 06/907,303, entitled "Procedure and Data Structure for Synthesis and Transformation of Logic Circuits," filed Sept. 12, 1986.

RELATED APPLICATIONS

In addition to U.S. application Ser. No. 06/907,303, the following related applications, all assigned to the assignee of the present application, are currently pending in the United States Patent and Trademark Office:

1) U.S. application Ser. No. 06/907,512 of Hooper et al., entitled "Rule Structure In A Procedure Of The Synthesis Of Logic Circuits," filed Sept. 12, 1986.

2) U.S. application Ser. No. 06/907,513 of Hooper et al., entitled "Rule Structure For Insertion Of New Elements In A Circuit Design Synthesis Procedure," filed Sept. 12, 1986.

3) U.S. application Ser. No. 06/907,514 of Hooper, entitled "Procedure For Incorporating Timing Parameters In The Synthesis Of Logic Circuit Design," filed Sept. 12, 1986.

4) U.S. application Ser. No. 06/907,515 of Hooper, entitled "Data Base Access Method For Rules Utilized By A Synthesis Procedure For Logic Circuit Design," filed Sept. 12, 1986.

5) U.S. application Ser. No. 06/907,516 of Hooper et al., entitled "Bitwise Implementation Mechanism For A Circuit Design Synthesis Procedure," filed Sept. 12, 1986.

The disclosure of each of the five related applications listed above, as well as the disclosure of U.S. application Ser. No. 06/907,303, is herein expressly incorporated by reference.

BACKGROUND OF THE INVENTION

This application relates to design of electrical circuits and semiconductor devices and, more particularly, to a knowledge based expert system for transforming a high level design entered by a user to a technology level representation of the design needed to manufacture a semiconductor device incorporating the design.

Design of an integrated circuit (IC) semiconductor device begins with a specification describing the overall function of the device. For example, a multiplier circuit may be specified to multiply two numbers together. If the input characteristics of the two numbers are known and the characteristics of the resultant output are known, the overall function of the multiplier circuit can be described. Other factors, such as power consumption, number of input and output connectors (I/O pins), and timing, may be included in the overall description of the circuit.

Semiconductor devices may be manufactured by a wide variety of processes or "technologies," such as TTL (transistor-transistor logic), CMOS (complementary metal oxide semiconductor), NMOS (N-channel metal oxide semiconductor), etc. Thus, it is important to be able to transform a generic high-level logic design into circuit components of a technology appropriate to a specific application.

A description of the desired circuit that spells out in detail the characteristics of the completed circuit is known as a high level design description. For example, a high level logic design description or, more simply, a high-level design may spell out the characteristics of a multiplier circuit. Such a description may specify one or more types of components, but does not necessarily designate specific components or how the components are connected. From the perspective of the opposite end of the design process, the required output of the process is a series of instructions which can be used by production machinery to actually form semiconductor raw materials into patterns and layers of metal and semiconductor material forming the desired circuit and to fabricate the IC device on a production line. Such a series of instructions is known as a "technology level representation" of the circuit.

The process of transforming the high-level design into a technology level representation is called "logic synthesis." The high-level design is initially represented in an artificial intelligence data base. The data base may include many different types of elements performing many different types of functions. Examples of elements are model definitions, model instances, port definitions, port instances, and signals. These elements are described in more detail below. The data base may also contain elements performing the same functions, but having different operating characteristics. Elements can be combined in many different combinations, but of course, not every type of element is operable with every other type, and not all elements within a given type are operable with all other elements of the same type.

There are, thus, a large number of "rules," which govern the combinations of elements within the data base. The logic synthesis process continuously and iteratively alters the design stored in the data base according to the rules. Thus, the logic synthesis process creates a more and more detailed description of a set of elements within the data base. The final result of the logic synthesis process is a technology representation that can be manufactured with, for example, computer aided manufacturing (CAM) techniques.

Logic synthesis thus involves selecting and combining elements of the data base according to the rules to transform a high-level design, which is initially stored in the data base, to a technology level representation.

Typically, the data base contains a library of logic element "model definitions" that are organized by function (e.g., Boolean components, adders, etc.) and by technology (e.g., TTL, CMOS, etc.) and a library of rules (a "rules library") for applying to specific instances of the model definitions.

One such data base is described in the above-referenced application Ser. No. 06/907,303, the disclosure of which is herein expressly incorporated by reference. In this data base, each model definition has associated parameters that describe function, timing, power, size, and other general attributes of circuit components. Each model definition has associated with it one or more "model instances." Each model instance describes a component that meets the criteria of the model definition.

The rules library typically contains hundreds of rules that are organized into one or more "rule bases" according to rule type and applicability. The rules are associated with the model definitions, model instances, and rule bases through a set of pointers that are established when the rules library is loaded into the data base.

The high-level design description is usually a detailed specification of the desired behavior of the device to be designed. As the high level design is loaded into the system, it is described by an initial set of model instances that are typically quite generic, i.e., the initial model instances usually do not define any specific component or technology. As described in the above-identified application, a set of bidirectional pointers are established by the data base between the initial model instances so that the initial set of model instances are interconnected to define the design at a high level. A pointer is also established between each model instance and the model definition with which it is associated in the data base, and pointers are also established between each such model definition and the rules in the rule base that are associated with it. A single model definition may have more than one associated model instance. However, a single model instance is an instance of only one model definition.

The rules are then tested and applied to each model instance according to a predetermined procedure to determine if the model instance (and possibly adjacent model instances connected to the model instance via the bidirectional pointers) can be replaced with new model instances, which are more specific in either in function or technology or both. As model instances are replaced by more specific model instances through the application of the rules, bidirectional pointers are established between the new set of model instances to again define the logic design, this time at a slightly more specific level. Rules are then applied to the model definitions pointed to by this set of model instances to replace them with an even more specific set of model instances.

This iterative procedure continues until the original high level design description has been transformed to a low level description of the design implemented with circuit elements chosen from the technology (such as CMOS) targeted by the user. This low-level description constitutes a final design, which is in the form of a data structure that represents an interconnection between the actual components that are to be used to manufacture the design. The data structure can then be input to a conventional Computer Aided Manufacturing (CAM) system in the form of instruction for fabricating the synthesized logic design.

Each of the model instances has associated with it a number of "parameters," which describe such aspects of the model instance as signal timing, pinout, and technology type such as TTL. Each parameter of a model instance has a parameter value for that instance. For example, both a first model instance and a second model instance may have a parameter A, describing signal timing. The parameter of the first model instance may have a parameter A value of 10 microseconds, however, while the parameter of the second model instance has a parameter A value of 5 microseconds.

Existing logic synthesis methods use various methods to determine which rules to apply first. A first existing logic synthesis method scans through all the rules each time a rule is sought to be applied to a given model definition to find the best rule for that definition. This first method can result in relatively long synthesis processing times. A second existing logic synthesis method partitions the rules into classes and subclasses so that fewer than all of the rules are tested when a rule needs to be applied to a model definition. This second existing method uses a pattern matching scheme to compare a rule test against a single component and its properties. A third existing logic synthesis method that is satisfactory when the target technology can be defined by boolean tree cells configures the component library as a forest of logic trees and structures the rules tests in the same manner. A series of abstract pattern matches are then made to test the rules.

In existing logic synthesis methods, the rules are generally applied with respect to all model instances in the design, which leads to relatively long run times if the design is very complex or the data base is quite large. Existing logic synthesis methods continue to apply rules with respect to every model instance currently present in the design, even if all but a few of the instances have reached stable form (i.e., have reached the appropriate level of functionality and the target technology). Thus, run time is needlessly spent applying rules to model instances that will not be changed further by the application of the rules.

It is often desirable to isolate a small, but critical, area of a circuit to be synthesized and to synthesize only that small part. Run time is unnecessarily long if all parts of a circuit must be synthesized at every pass. Alternately, a user may wish to synthesize a small portion of a circuit in several different technology representations.

SUMMARY OF THE INVENTION

The present invention overcomes the problems and disadvantages of the prior art by 1) designating as VISIBLE only those model instances of interest and designating all other model instances as INVISIBLE, such that only rules associated with VISIBLE model instances are applied; 2) designating model instances as NEW if they have recently had associated rules that evaluated to TRUE and designating all other model instances as INACTIVE, such that only rules associated with NEW model instances are applied; 3) designating as DELETED those model instances deleted by application of a rule and designating all other model instances as non-DELETED, such that only rules associated with non-DELETED model instances are applied; and 4) grouping model instance-rule pairs by a value called "SIZEWIN value" representing either the number of model instances replaced by the rule of each pair or a predetermined value associated with the rule of each pair, such that the groups having rules replacing the most model instances or having the highest predetermined SIZEWIN values are applied first.

Advantages of the invention will be set forth in part in the description which follows and, in part, will be obvious from the description or may be learned by practice of the invention. The advantages of the invention will be realized and attained by means of the elements and combinations particularly pointed out in the appended claims.

In accordance with the purpose of the invention, as embodied and broadly described herein, the circuit design synthesis process of the invention relates to the replacement of a first set of model instances stored in a data base and representing the circuit design with a second set of model instances stored in the data base and representing specific logic components of the circuit design by applying a set of rules to the first set of model instances and to altering parameter values of objects in the data base by application of the set of rules. The process comprises the steps of: storing the set of rules in the data base, subsets of the rules being associated with model instances in the first set of model instances, each associated rule capable of being applied to replace at least one model instance in the first set with at least one new model instance in the second set or to alter a parameter value of an object in the data base, and each rule having an associated SIZEWIN value representing a figure of merit; assigning an associated rule to at least one of the model instances in the first set to provide a set of instance-rule pairs; arranging the set of instance-rule pairs into groups according to the SIZEWIN values of the rules of the pairs; and applying the rules of the instance-rule pairs by group.

Further, in accordance with the purpose of the invention, as embodied and broadly described herein, the circuit design synthesis process of the invention relates to the replacement of a first set of model instances stored in a data base and representing the circuit design with a second set of model instances stored in the data base and representing specific logic components of the circuit design by applying a set of rules to the first set of model instances and to altering parameter values of objects in the data base by application of the set of rules. The process comprises the steps of: storing a set of rules in the data base, subsets of the rules being associated with model instances in the first set of model instances, each associated rule capable of being applied to replace at least one model instance in the first set with at least one new model instance in the second set or to alter a parameter value of an object in the data base; designating ones of the first set of model instances as VISIBLE; and applying ones of the subsets of rules associated with the VISIBLE model instances in the first set of model instances to replace ones of the first set of model instances with model instances in the second set.

Further, in accordance with the purpose of the invention, as embodied and broadly described herein, the circuit design synthesis process of the invention relates to the replacement of a first set of model instances stored in a data base and representing the circuit design with a second set of model instances stored in the data base and representing specific logic components of the circuit design by applying a set of rules to the first set of model instances and to altering parameter values of objects in the data base by application of the set of rules. The process comprises the steps of: storing the set of rules in the data base, subsets of the rules being associated with model instances in the first set of model instances, each associated rule capable of being applied to replace at least one model instance in the first set with at least one new model instance in the second set or to alter a parameter value of an object in the data base; assigning an associated rule to at least one of the model instances in the first set to provide a set of instance-rule pairs, wherein performance of the assigning step results in other model instances of the first set lacking an assigned rule; applying the rules of the instance-rule pairs; and designating as INACTIVE the model instances lacking an assigned rule.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 3 shows an example of connectivity between model instances in the data base of FIG. 1;

FIG. 5 is a format of a rule of the data base of FIG. 1;

FIG. 9 is a table showing instance-rule pairs and SIZEWIN groupings generated according to the method of FIG. 6;

DETAILED DESCRIPTION OF THE PREFERRED EMBODIMENTS

Figure 1:
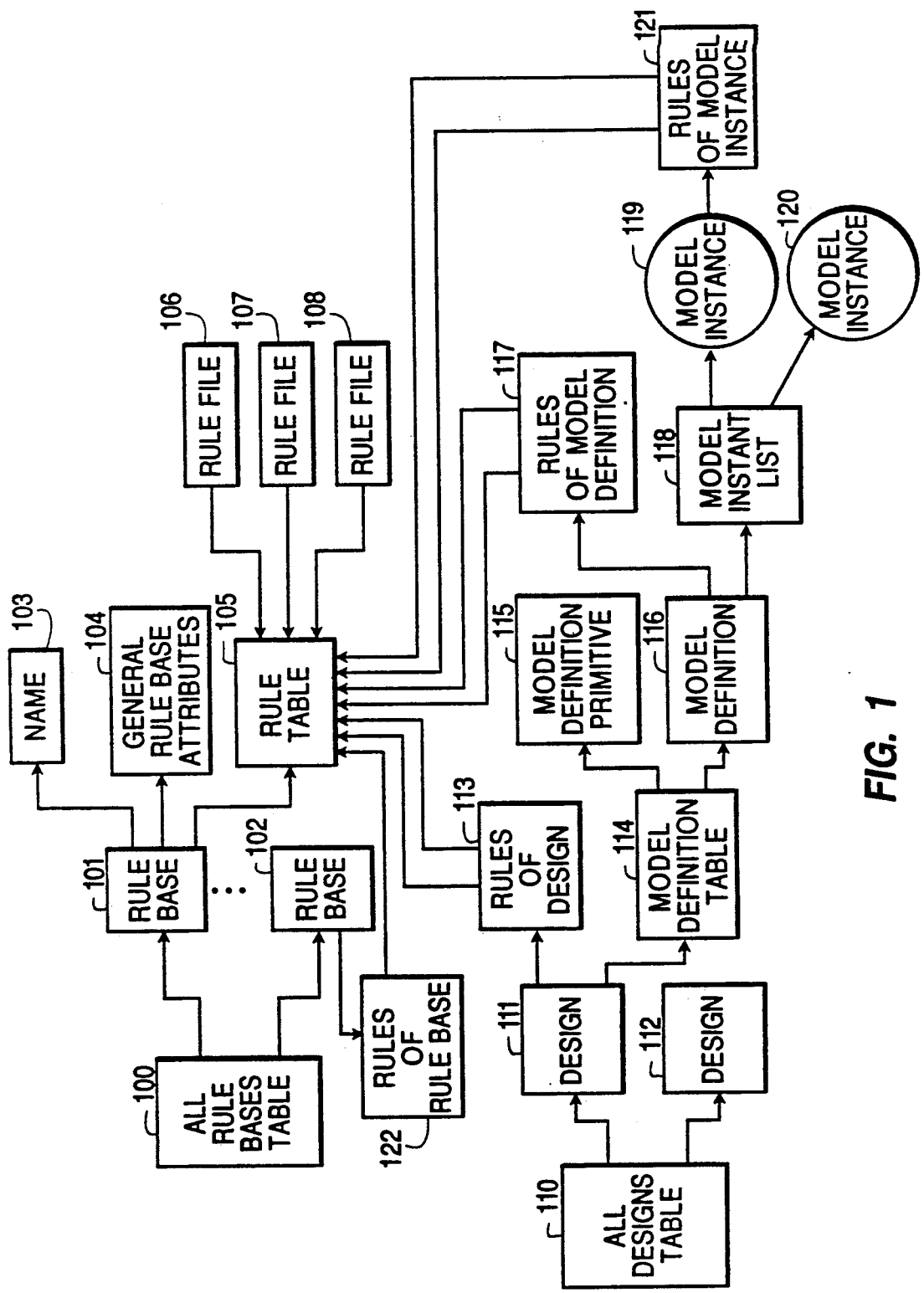
FIG. 1 is an overview of a data base format.

Reference will now be made in detail to the present preferred embodiments of the invention, examples of which are illustrated in the accompanying drawings. Wherever possible, the same reference numbers will be used throughout the drawings to refer to the same or like parts.

In the present invention, model instances in the logic circuit data base are designated as VISIBLE/INVISIBLE, NEW/INACTIVE, and DELETED/non-DELETED. It is occasionally desirable to synthesize only a portion of a desired circuit. For example, a user may wish to create several different technology representations of a small portion of a single circuit. In this case, because the synthesis procedure must be performed several times, it is advantageous to "localize" a desired portion of the high-level description and to perform the synthesis procedure only for that portion. Model instances are designated as VISIBLE by a user if the model instances are included in a portion of the circuit to be synthesized that the user wishes to localize. The VISIBLE/INVISIBLE designation of a model instance will not change throughout the synthesis procedure. A model instance replacing a VISIBLE model instance will be VISIBLE.

All model instances are initially designated as NEW. When no applicable rule is found for a model instance, that model instance becomes INACTIVE and is not made NEW again until one of its neighboring model instances has a rule applied thereto.

All model instances are initially designated as non-DELETED. A model instance is designated as DELETED when application of a rule removes it from the data base, as described above. Rules affecting DELETED model instances evaluate to FALSE. Rules associated with DELETED model instances evaluate to FALSE.

All INVISIBLE model instances are INACTIVE. An INVISIBLE model instance can be deleted by application of a rule associated with some other model instance.

In accordance with the present invention, all rules in the data base have an associated SIZEWIN value. This SIZEWIN value is a figure of merit indicating the relative benefit of applying the rule and usually represents a number of model instances removed or replaced by an application of the rule. For example, the rule "take out"

described above replaces one model instance and, therefore, would have a default SIZEWIN value of "1." Alternately, as described above, the user can specify a predetermined SIZEWIN for the rule when the rule is defined. The above-referenced application Ser. No. 06/907,303 discloses a SIZEWIN field. However, the SIZEWIN field of the above-referenced application is not used as described below for the present invention.

The invention comprises means for storing the set of rules in the data base, subsets of the rules being associated with model instances in a first set of model instances, each associated rule capable of being applied to replace at least one model instance in the first set with at least one new model instance in the second set, and each rule having an associated SIZEWIN value representing a figure of merit. In a preferred embodiment of the invention, this means is embodied in memory 1204 of FIG. 12.

FIG. 1 shows an overview of the data base described in the above-referenced U.S. application Ser. No. 06/907,303. An all rule bases table 100 points to various groups of rules, referred to as rule bases 101 and 102. Each rule base 101 and 102 has an associated name 103 and general rule base attributes 104, as described below. Each rule base 101 and 102 also contains a pointer to a rule table 105, which contains pointers to rules currently being considered for application to the model instances. Each rule base 101 and 102 also points to a rules of rule base table 122, which indicates general design rules applicable to that rule base.

Rules are contained in rule files 106, 107, and 108. The rule table 105 contains pointers to the rules in the rule files, instead of containing the actual rules. The rule table 105 is itself pointed to by the rules of rule base table 122, a rules of design table 113, and at least one rules of model definition table 117. Rules of rule base table 122 indicates general purpose rules that may apply to any model instance and to any design with which the rule base 101, 102 pointing to rules of rule base table 122 is intended for use. Rules of design table 113 indicates rules that may apply to any model instance, i.e. general design rules applicable throughout the system. The rules of model definition table 117 indicates rules that are to be applied to a specific model definition. The rules of model instance table 121 indicates rules that are to be applied to a specific model instance.

An all designs table 110 points to design information 111 and 112 for various logic designs to be synthesized by the system. Each design information 111 and 112 points to a model definition table, which indicates all the current model definitions available for that logic design and a rules of design table 113.

Model definitions may be of two types. A model definition primitive 115 is a low level component with no model instances, such as an inventor. A model definition 116 is a more abstract higher level component, such as an ALU (Arithmetic Logic Unit), etc., which may have one or more model instances meeting the general requirements of the model definition, and having a more detailed description of the model definition. Each model definition 116 contains a pointer to a rules of model definition table 117 and a model instance list 118. The model instance list 118 points to all model instances in the current logic design that fit the generic description of the model definition 116. For example, a model definition for an inverter may have mode instances representing a CMOS inverter, a TTL inverter, etc. In addition, some model instances 122 have rules associated only with that specific model instance. These rules are accessed through a rules of model instance table 121 accessible by the model instance 122.

During the circuit synthesis process, a rule to be associated with each model instance is chosen from rules of model instance table 121 if possible. If no applicable rule is found in rules of model instance table 121, the tables are searched in the following order until an applicable rule is found: rules of model definitions table 117, rules of design 113, rules of rule base 122.

Figure 2:
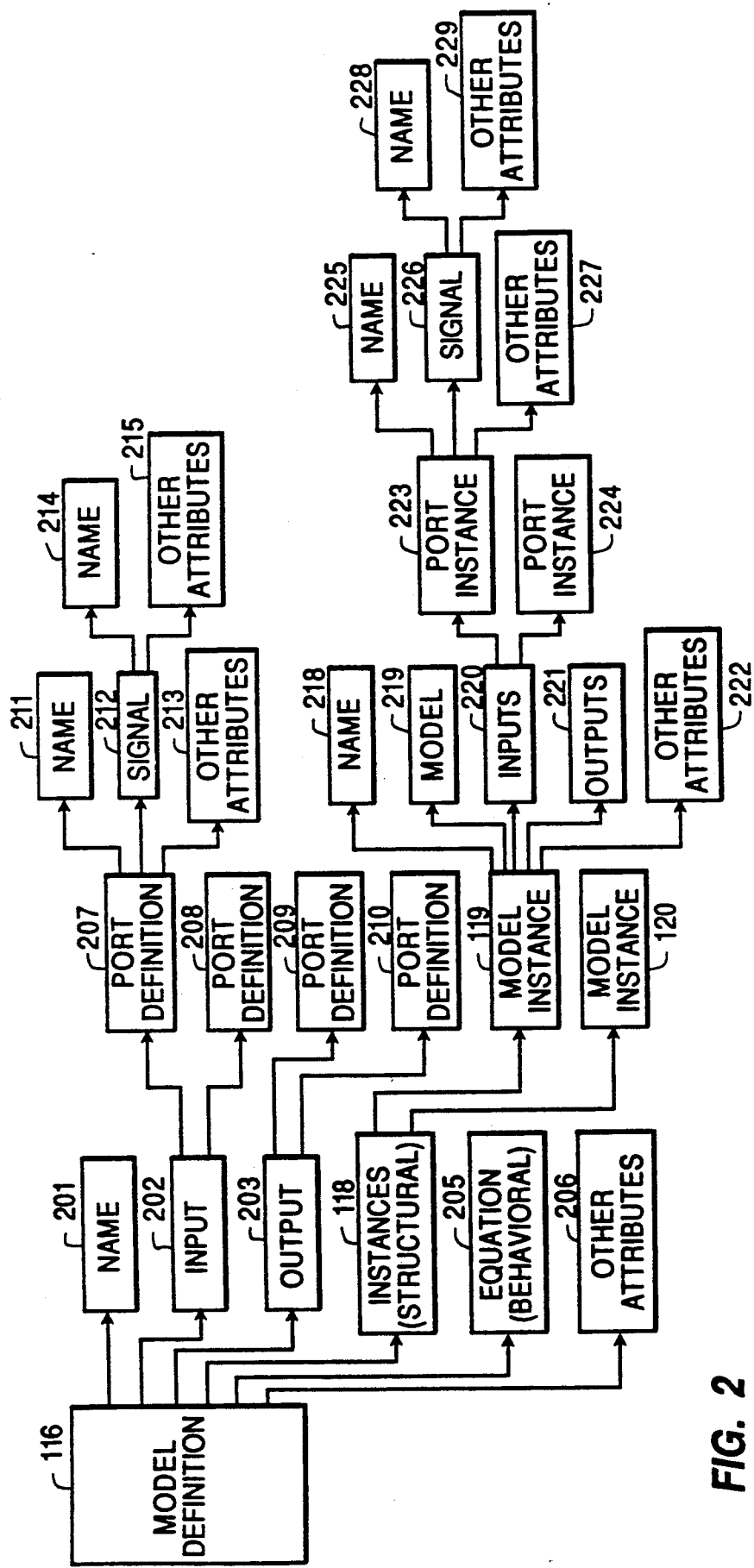
FIG. 2 is an expanded format for a model definition of FIG. 1.

FIG. 2 shows an expanded version of model definition 116 and the information associated therewith in the data base. FIG. 2 is included herein for informational purposes and does not purport to show physical connections within the logic circuit synthesis data base. Each model definition 116 has a name 201, a list of inputs 202, and a list of outputs 203. As described above, each model definition 116 has associated model instances, for example model instances 119 and 120, here pointed to by a model instances list 118. In addition, some model definitions 116 have associated behavioral equations 205, which function as an alternate more compact description of the logic function and connectivity of the model definition. One example of a behavioral equation is the equation format of the rules. Lastly, each model definition 116 has other associated attributes 206, which will not be discussed here and are not required for an understanding of the present invention.

List of inputs 202 and list of outputs 203 point to port definitions 207 and 208 and to port definitions 209 and 210, respectively. Port definitions 207–210 define the inputs and outputs of the specific model definition. Each port definition 207–210 has an associated name 211, signal 212, and other attributes 213 not described here. Each signal 212 describes the connectivity between two or more model definition in the circuit and has an associated name 214 and other attributes 215, such as the signal width or the value of the most significant bit of the signal.

Each model instance 119 and 120 has an associated name 218, a pointer 219 back to the model definition 116 with which the model instance is associated, inputs 220, outputs 221, and other attributes 222. Inputs 220 and outputs 221 have associated information describing associated port instances 223 and 224. Each port instance 223 and 224 describes an instance of one of port definitions 207 or 208 and has an associated name 225, an associated signal 226, and other attributes 227, such as printout. Signal 226 describes connectivity between two or more model instances in the circuit and has an associated name 228 and other attributes 229, such as timing constraints.

The attributes of model definitions, model instances, port definitions, port instances, inputs, outputs and signals are also called "parameters." Different model instances, for example, may have different parameter, associated therewith. In addition, model instances having the same parameters may have different values for these parameters.

FIG. 3 shows an example of the bidirectional pointers established between model definitions and model instances in the data base. This relationship called "connectivity." In FIG. 3, model definitions are shown as large rectangles. Model instances and port instances are shown as circles. Other components are shown as small rectangles. Model definition 310 and model instance 330 point to respective rules 312 of rule base 314. Model definition 310 also points to port definition 320 and to model instance 330. A port instance 322 connected to model instance 330 points to port definition 320. Model instance 330 is connected to model instances 340, 350, and 360 through port instance 332 and signal 370 and through respective port instances 342, 352, and 362. Port instances 354 and 364 are unused in this example.

Figure 4:
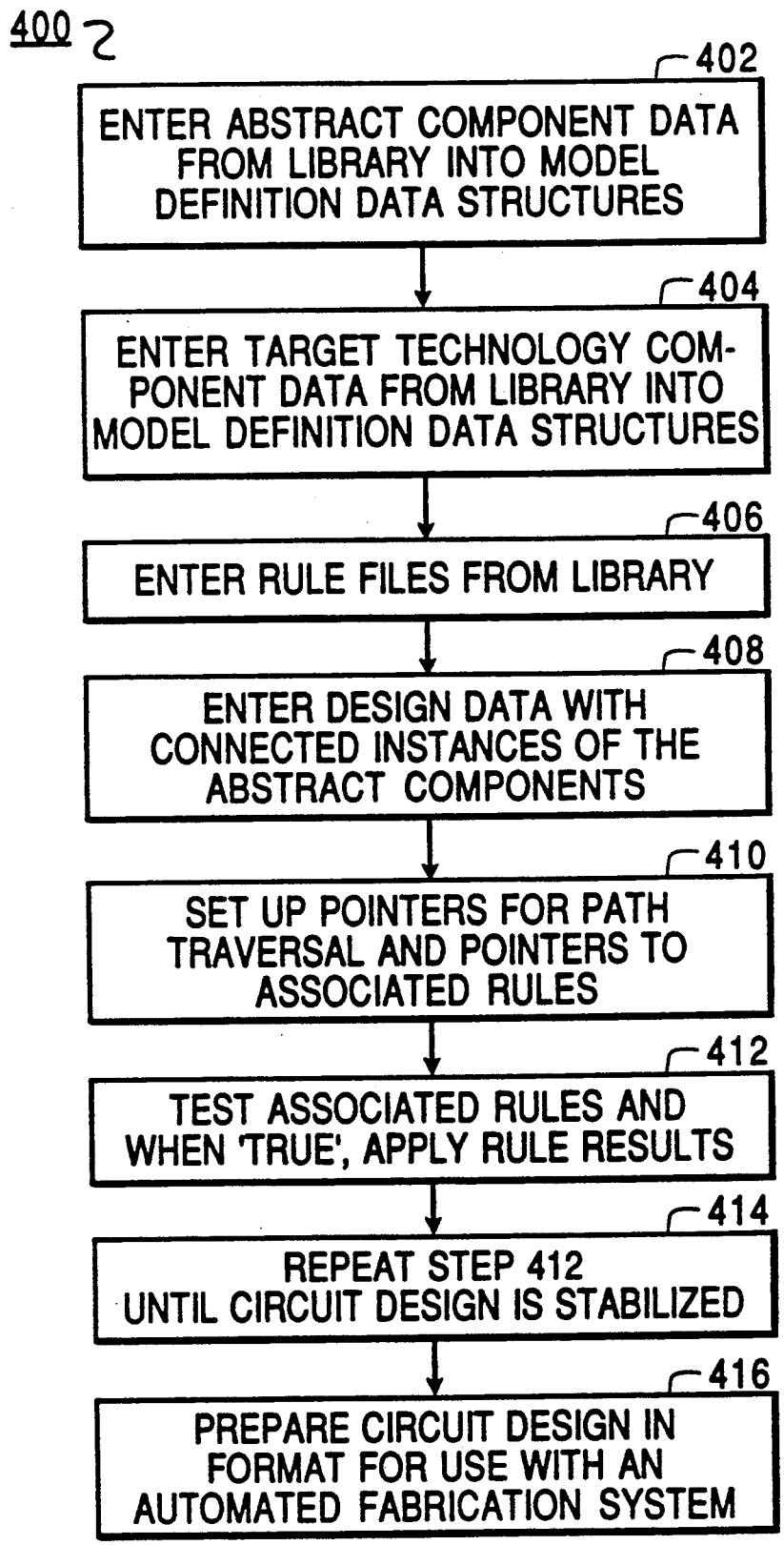
FIG. 4 is a flow chart of a method used to synthesize logic circuit designs using the data base of FIG. 1.

FIG. 4 is a flow chart 400 of the method used to synthesize logic design circuits using the above-described data base. This method is disclosed in the above-referenced U.S. application Ser. No. 06/907,303. First, data is entered into the model definition data structures in steps 402 and 404. Data is also entered into the rule table at this time at step 406. Then the high-level abstraction of the design to be synthesized, i.e., the initial model instances are entered in step 408. Connectivity, i.e., pointers, between the various model instances and rules is established with a "pointification" process in step 410. Next, in steps 412 and 414, the rules associated with the model definitions of the current model instances are tested and applied when "TRUE" until the logic circuit design is stabilized. Lastly, in step 416, the stabilized circuit design is output in a format suitable for controlling a CAM system.

In the loop formed of steps 412 and 414, an associated rule is applied to each of the model instances in turn until a rule has been applied to each model instance. The process of applying a rule to each model instance in turn is called a "pass." Several existing methods for determining which associated rule to apply to a model instance are described below.

FIG. 5 is a diagram showing the format of a rule 500 in the data base. The format of rule 500 is similar to formats used in the LISP computer languages and is shown in more detail in the above-referenced U.S. application Ser. No. 06/907,512.

Each rule 500 includes a lefthand side (lhs) or antecedent portion 502 and a righthand side (rhs) or consequence portion 504. Antecedent portion 502 contains one or more test conditions that must all be TRUE before the rule is applied. Consequence portion 504 contains one or more actions to be performed during application of the rule if antecedent portion 502 is TRUE. An arrow 506 composed of three ASCII characters separates antecedent portion 502 from consequence portion 504.

Rule 500 may also contain optional information 508 such as, for example, a SIZEWIN value 510. SIZEWIN value 510 is used to specify the desirability of applying rule 500 and usually represents a number of model instances deleted or replaced by the rule. Alternately, SIZEWIN value 510 may be set to a predetermined number.

One action performed during application of a rule 500 is to replace one or more model instance with other model instances. For example, a rule "map 2-input OR" that replaces a single model instance has the format of FIG. 5 and appears as follows:

```
(defrule "map 2-input OR"
    "replace any 2-input OR with TECHCELL"
    :sizewin 2
    :version 0
    :group "mapping rules"
    (model is OR)
    (count-ins is 2)
    →
    (replace *instance* with out = (TECHCELL ins))
)
```

In the above example, the rule is named "map 2-input OR". The function of the rule is to replace any "2-input OR" model instance with a model instance that, in this example, is named "TECHCELL". The rule has been assigned a SIZEWIN value of "2." If the SIZEWIN value had not been specified, the rule would have had a SIZEWIN value of "1" because one model instance is replaced by the rule. The version number, "0," has no effect upon the rule operation. Rule "map 2-input OR" belongs to a rule group "mapping rules." Antecedent portion 502 contains two test conditions: (1) the model instance with which the rule is associated must be an OR model instance and (2) the model instance with which the rule is associated must have exactly two inputs. Consequence portion 504 specifies that the model instance, "*instance*", with which the rule is associated should be replaced with a "TECHCELL" model instance.

Another action performed during application of a rule 500 is to remove one or more model instances. For example, a rule "take out" that removes a single model instance has the format of FIG. 5 and appears as follows:

```
(defrule "take out"
    (no signals-of-outputs are present)
    →
    (remove *instance*)
)
```

Rule "take out" contains an antecedent test that evaluates whether the current model instance with which it is associated has any outputs. When the antecedent test evaluates to "TRUE," the consequence portion of the rule will be applied. Therefore, the rule removes the model instance with which it is associated when the model instance has no outputs.

Another action performed during application of a rule 500 is to change the values of one or more of other attributes 222, 227, or 229 associated with a model instance. For example, a rule "modify_syn.hi" that has the format of FIG. 5 and appears as follows:

```
(defrule "modify syn.hi"
    "modify the value of the syn.hi parameter to convert
        output pin to high"
    :version 0
    (syn.hi_drive-1st-out is not_present)
    (timingdebt-1st-out > 0)
    →
    (modify syn.hi_drive-1st-out with TRUE)
)
```

Rule "modify syn.hi" determines whether a parameter, i.e., an attribute, named "syn.hi" of a first output of the current model instance is not set to a high value, and if the timing of the circuit design so far is over allowable propagation delay. If so, the parameter "syn.hi" of the first output of the current model instance is set to a value of TRUE. In a preferred embodiment of the present invention, this parameter value setting is achieved by execution of a SETF function of the LISP programming language.

Figure 6:
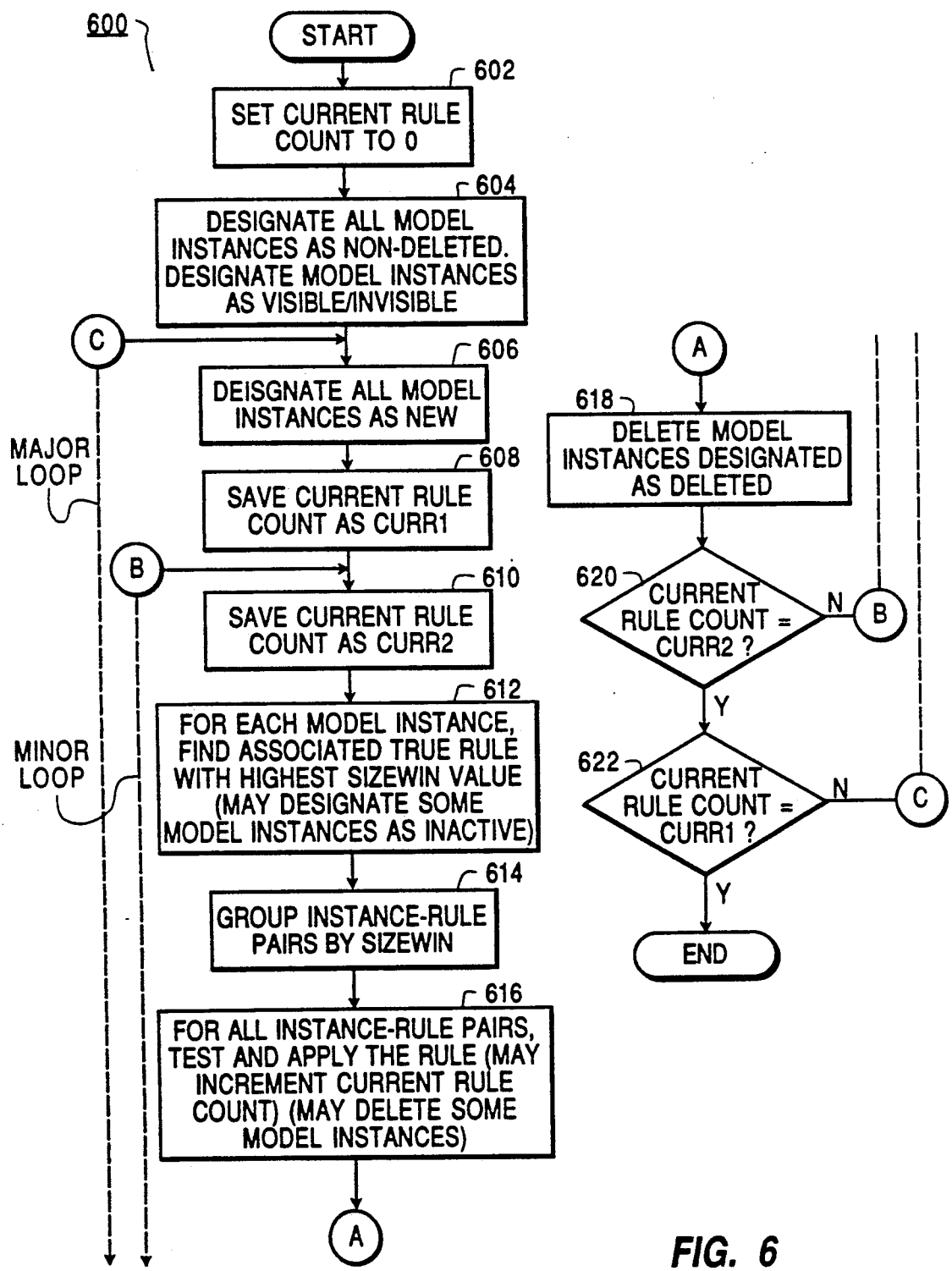
FIG. 6 is a flow chart of a method of selecting and applying rules to model instances according to a preferred embodiment of the present invention.

FIG. 6 is a flow chart 600 of a method of selecting and applying rules to model instances according to a preferred embodiment of the present invention. Flow chart 600 contains a major loop and a minor loop. One iteration of the minor loop corresponds to one pass through all the current model instances. The major loop is exited when the circuit design is stabilized.

In step 602, a current rule count is set to zero. The current rule count represents a total number of rules applied during the logic synthesis procedure. In step 604, all the model instances are designated as non-DELETED and various model instances are designated as VISIBLE or INVISIBLE, depending on which areas of the logic circuit the user wishes to localize. In step 606, all model instances are designated as NEW. In step 608, the current rule count is saved as CURR1. In step 610, the current rule count is saved as CURR2. In step 612, model instance-rule pairs (hereinafter instance-rule pairs) for one iteration of the minor loop are determined. Each model instance is paired with an associated rule that evaluates to TRUE and that has a highest SIZEWIN value of all TRUE rules associated with that model instance. Step 612 is discussed further in connection with FIG. 7 below. In step 614, the instance-rule pairs are grouped by SIZEWIN value. In step 616, the instance-rule pairs are tested and applied in order according to their SIZEWIN groupings, with the highest SIZEWIN rules being tested first. During step 616, if a model instance is deleted by application of a rule, the model instance is marked as DELETED, but is not removed from the data base. Model instances marked as DELETED are not actually deleted from the data base until after step 616 is completed, in step 618. Step 616 is discussed further in connection with FIG. 8 below.

Step 620 determines whether the rule count stayed the same during the most recent iteration of the minor loop. If not, i.e., if a rule was applied, control passes to step 610. Otherwise control passes to step 622. Step 622 determines whether the rule count stayed the same during the most recent iteration of the major loop. If not, i.e., if a rule was applied, control passes to step 606. Otherwise the circuit design is considered to be stabilized and processing is ended.

Figure 7A:
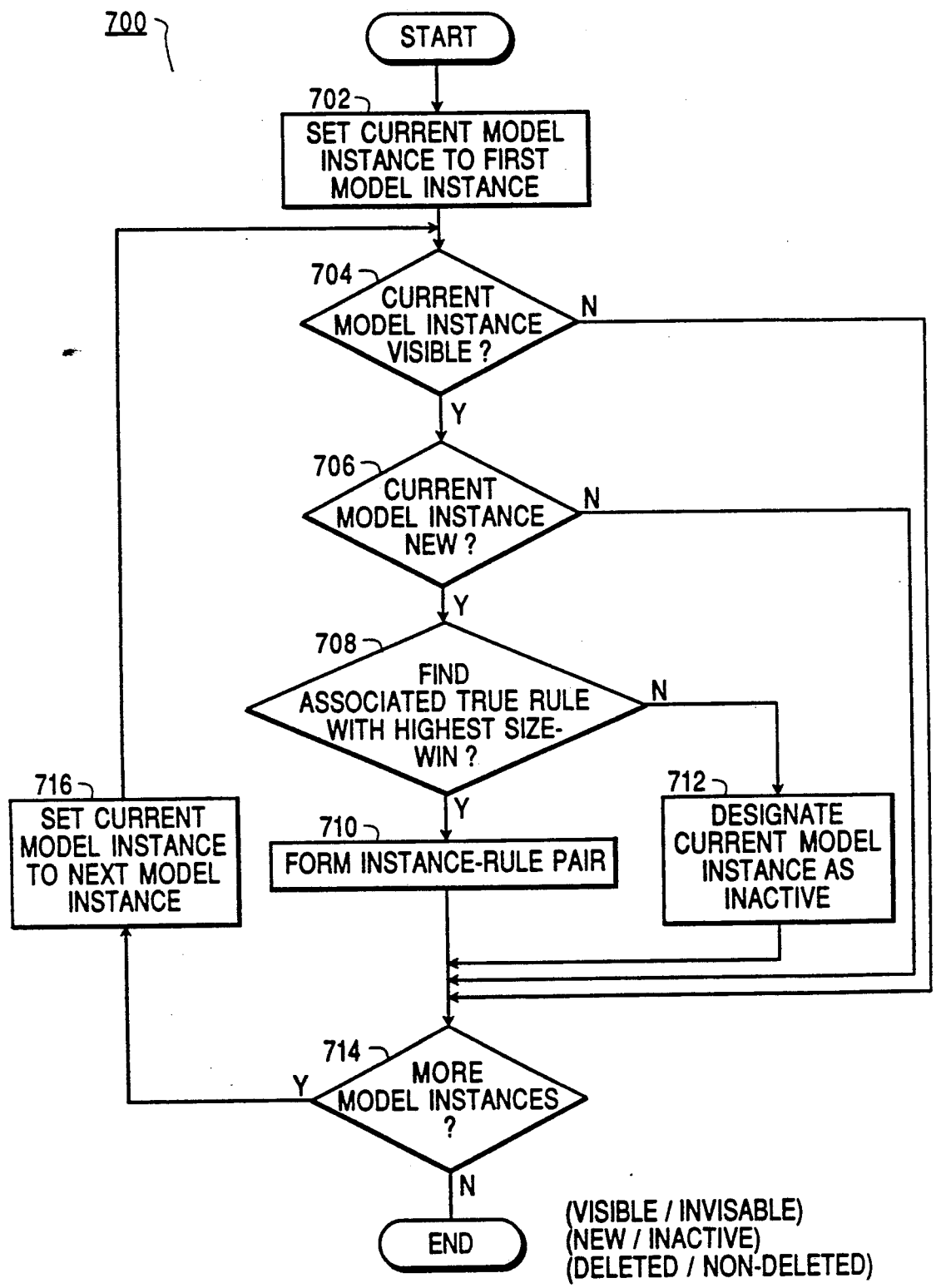
FIGS. 7(a), 7(b), and 7(c) are flow charts further describing the method of selecting rules of FIG. 6.
Figure 7B:
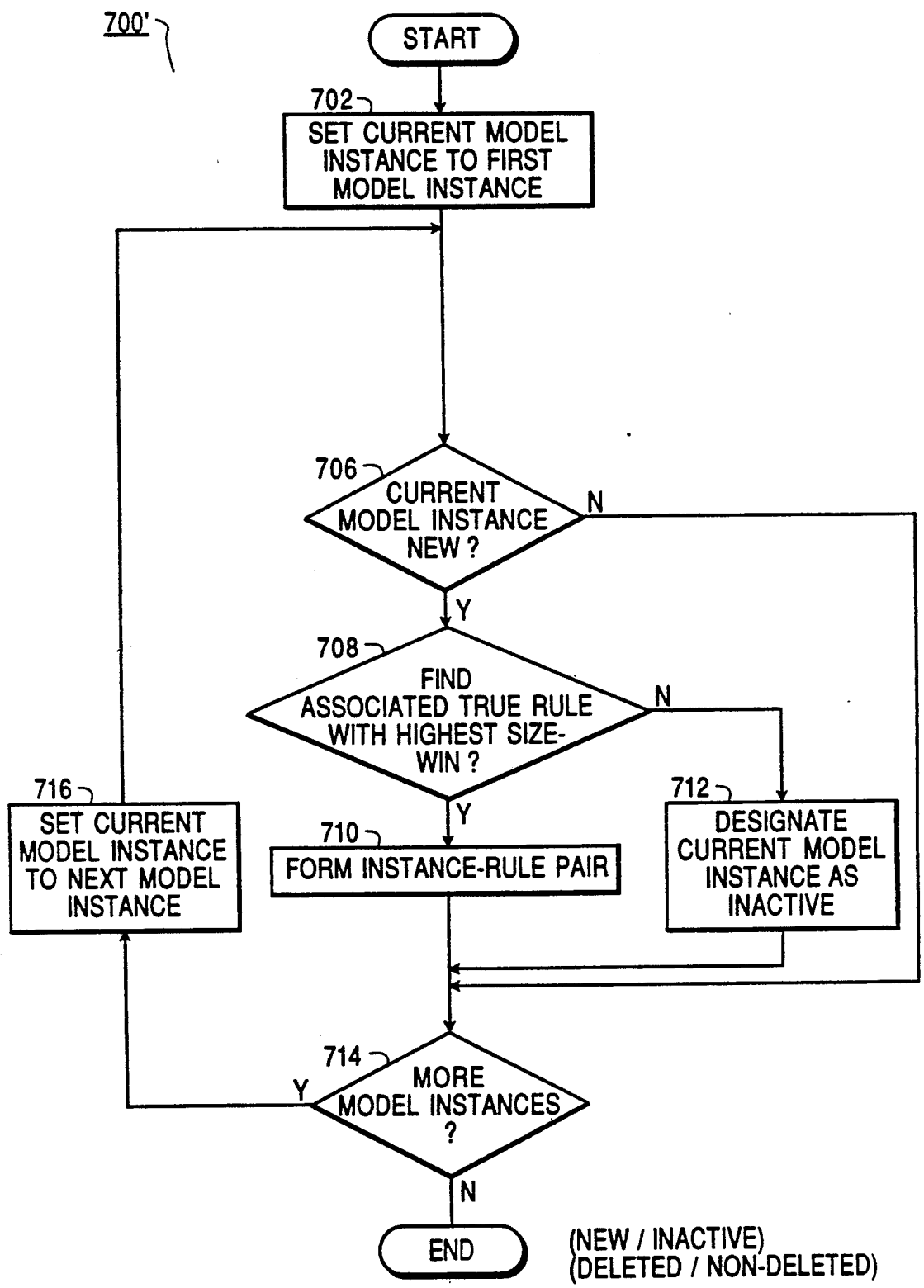
Figure 7C:
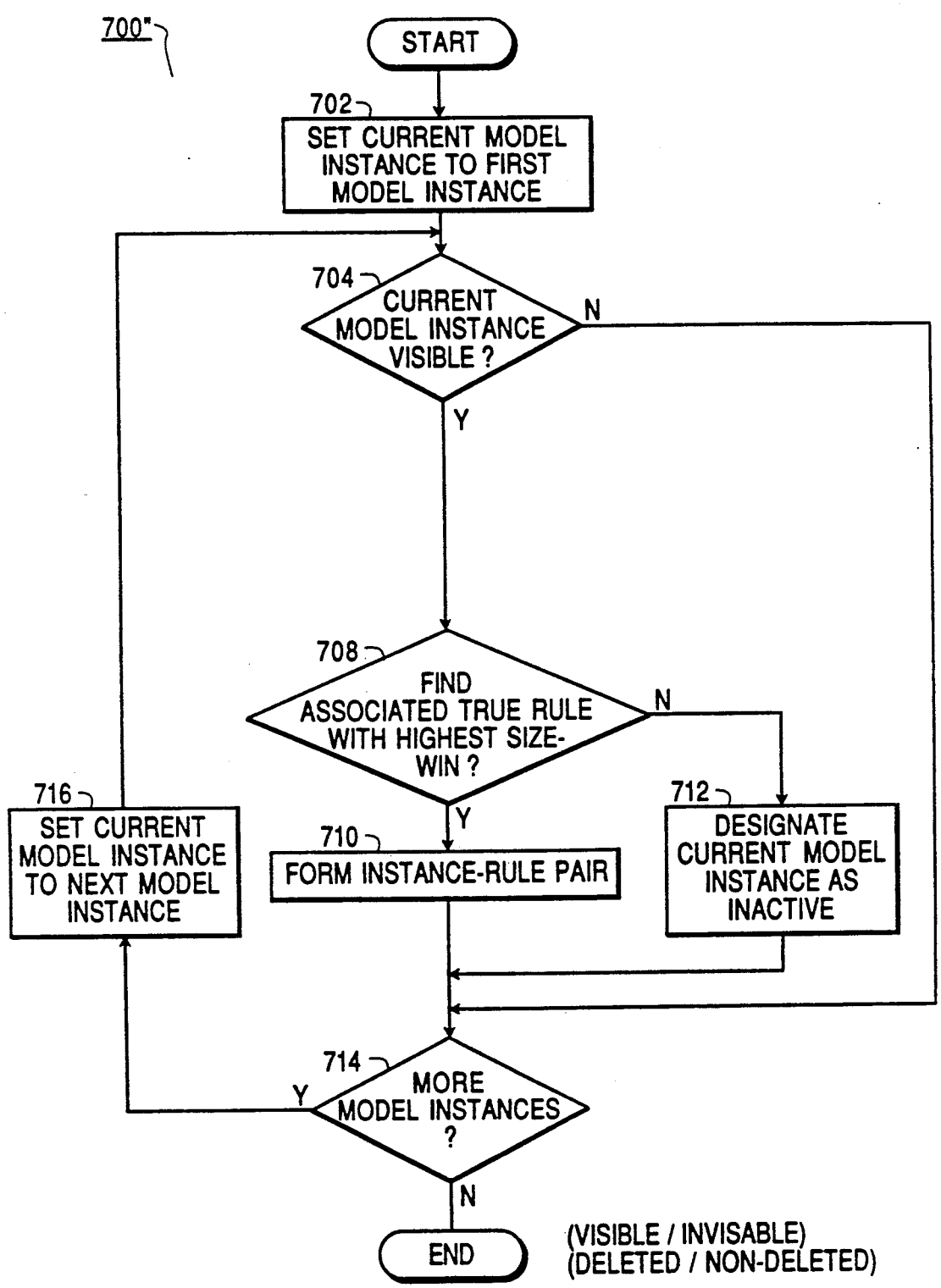

FIGS. 7(a) through 7(c) are flow charts 700, 700, and 700", respectively, showing step 612 of FIG. 6 in more detail. Thus, FIGS. 7(a) through 7(c) show how the instance-rule pairs for one iteration of the minor loop of FIG. 6 are determined in accordance with a preferred embodiment of the present invention. Each model instance is paired with its associated rule that evaluates to TRUE and has the highest SIZEWIN of all the TRUE rules associated with that model instance. The steps of flow chart 700 are performed when a logic synthesis system incorporates the VISIBLE/INVISIBLE, NEW/INACTIVE, and DELETED/non-DELETED designations. The steps of flow chart 700' are performed when a logic circuit synthesis system incorporates the NEW/INACTIVE and DELETED/non-DELETED designations but not the VISIBLE/INVISIBLE designation. The steps of flow chart 700" are performed when a logic circuit synthesis system incorporates the VISIBLE/INVISIBLE and DELETED/non-DELETED designations but not the NEW/INACTIVE designation. A person skilled in the art will understand that flow charts 700' and 700" are very similar to flow chart 700 and contain common steps. Thus, the steps of flow chart 700 discussed herein are understood also to apply to flow charts 700' and 700".

Step 702 establishes a first model instance as the "current model instance." Step 704 determines if the current model instance has been designated as VISIBLE. If so, control passes to step 706 (step 708 in flow chart 700"). If not, control passes to step 714. Step 706 determines if the current model instance has been designated as NEW. If so, control passes to step 708. If not, control passes to step 714. Step 708 determines whether the current model instance has at least one associated rule that evaluates to TRUE. If more than one such rule exists, step 708 selects the associated TRUE rule with the highest SIZEWIN and control passes to step 710 where the current model instance and the selected rule are placed in an instance-rule pair. If no associated TRUE rules exist for the current model instance in step 708, control passes to step 712 (step 714 in flow chart 700"). In step 712, the current model instance is designated as INACTIVE. This step is not performed for logic synthesis systems not designating model instances as NEW/INACTIVE. Step 714 determines whether more model instances still need to be paired. If so, a new current model instance is selected in step 716 and control returns to step 704. If not, the steps of FIG. 7(a) are completed.

Figure 8A:
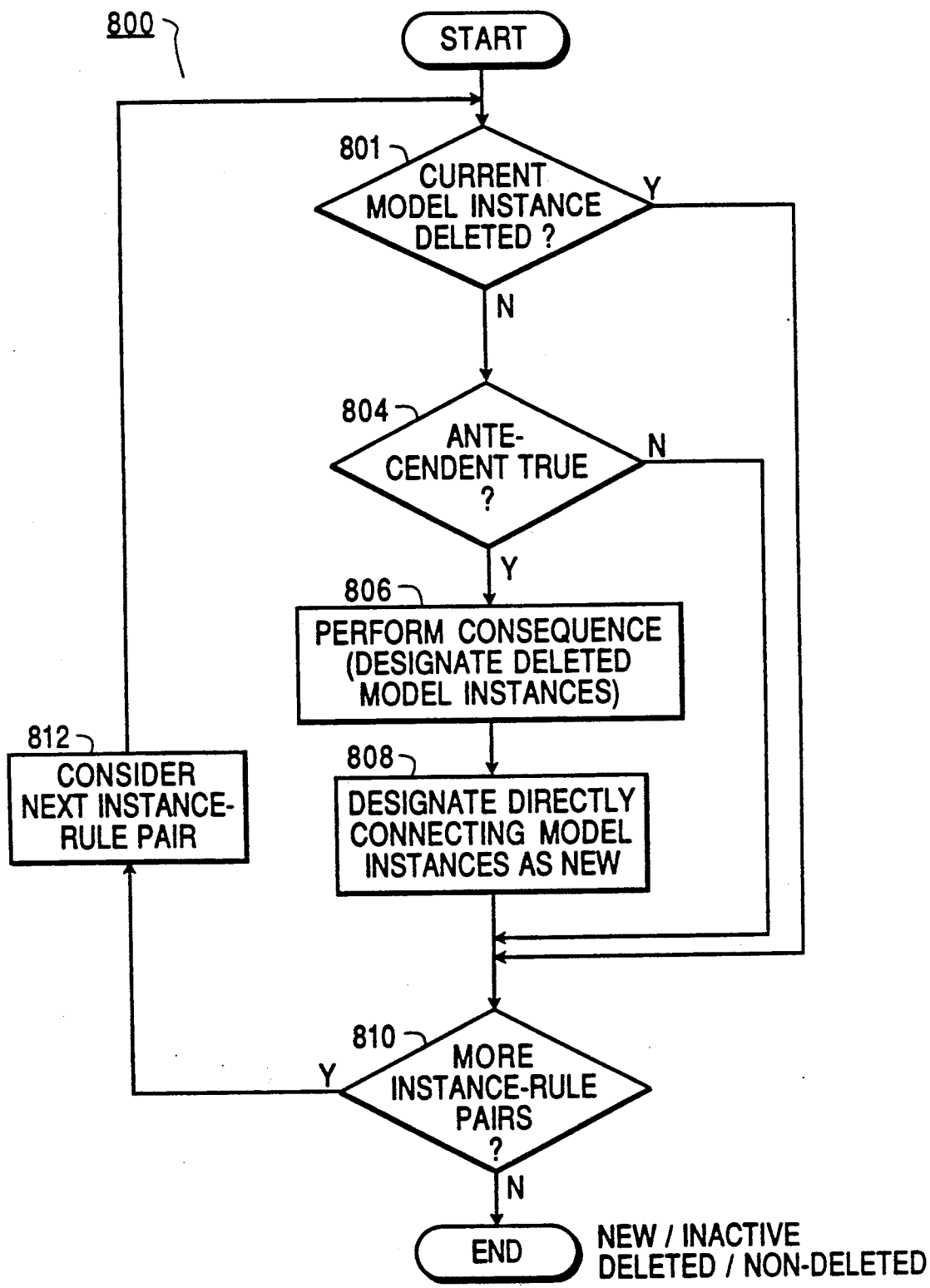
FIGS. 8(a) and 8(b) are flow charts further describing the method applying rules of FIG. 6.
Figure 8B:
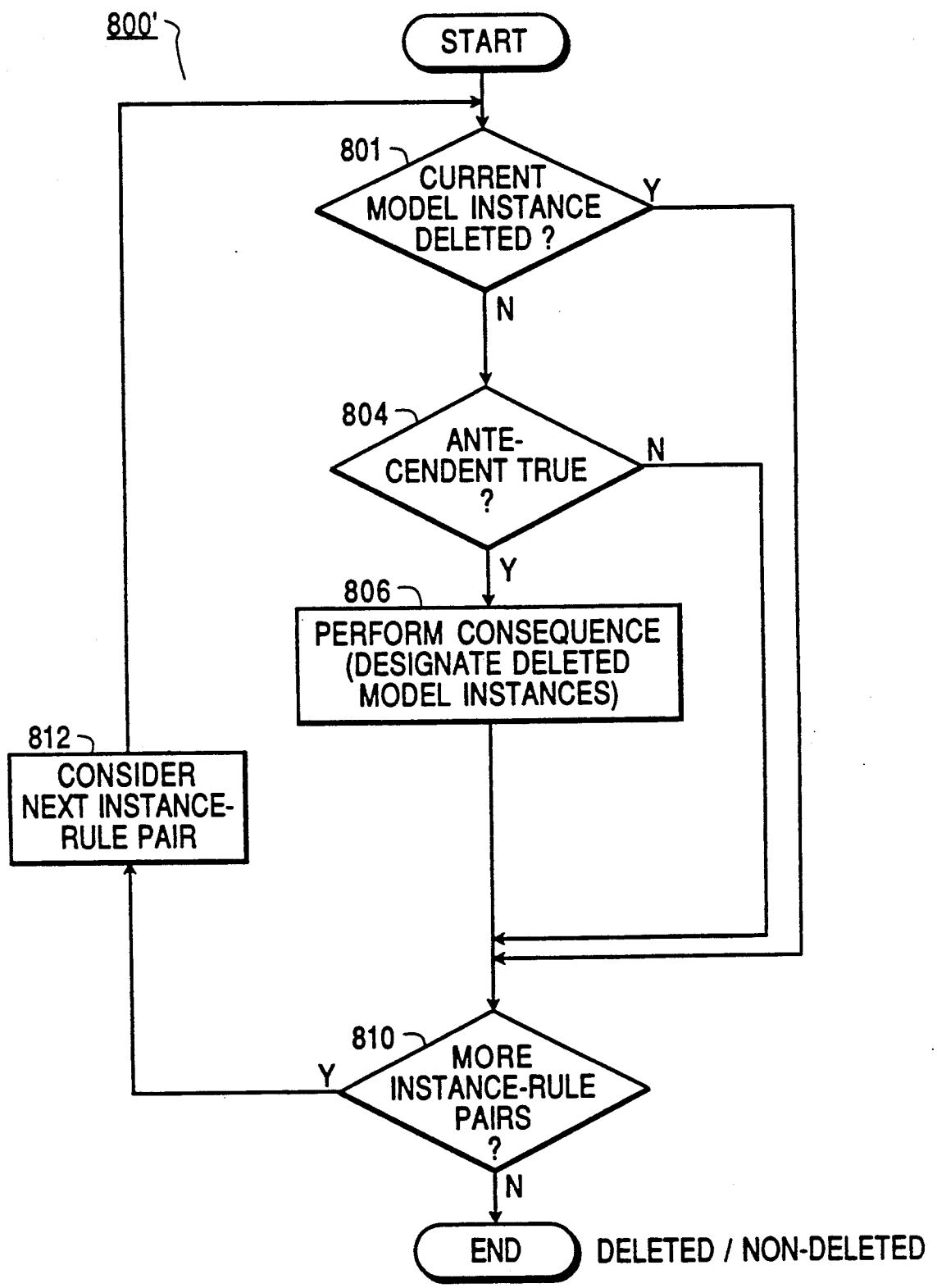

FIGS. 8(a) and 8(b) are flow charts 800 and 800', respectively, further describing step 616 of FIG. 6. Thus, FIGS. 8(a) and 8(b) describe the steps performed in accordance with the present invention to test and apply each rule of the instance-rule pairs. The instance-rule pair being tested is called the current pair. A rule of the current pair is called the current rule. A model instance of the current pair is called the current model instance.

The steps of flow chart 800 are performed when a logic synthesis system incorporates the NEW/INACTIVE and DELETED/non-DELETED designations. The steps of flow chart 800' are performed when a logic synthesis system incorporates the DELETED/non-DELETED designation, but not the NEW/INACTIVE designation. A person skilled in the art will understand that flow chart 800' is very similar to flow chart 800 and contains common steps. Thus, the steps of flow chart 800 discussed herein are understood to apply to flow chart 800'.

Step 801 determines whether the current model instance has been designated as DELETED. If so, control passes to step 810. Otherwise, control passes to step 804. Step 804 determines whether the antecedent portion of the current rule is TRUE. Persons skilled in the art will understand that, although step 708 of FIG. 7 determined that the current rule was TRUE when the current pair was created, subsequent applications of other rules may have caused the current rule to become FALSE. If the current rule is TRUE, the consequence portion of the current rule is performed in step 806. If the current rule is FALSE, control passes to step 810. Step 808 (FIG. 8(a) only) designates the current model instance and all model instances connected to the current model instance in the circuit as NEW. Step 810 determines if more instance-rule pairs exist. If so, control returns to step 801 and the above steps are repeated for a new instance-rule pair. Otherwise, processing for FIG. 8 is completed.

FIG. 9 is a table showing an example of instance-rule pairs and SIZEWIN groupings. A data base contains model instances $i_1$ through $i_8$. Model instance $i_1$ has associated rules $r_1$, $r_5$, and $r_7$. Model instance $i_2$ has associated rules $r_2$ and $r_4$. Model instance $i_3$ has associated rule $r_3$. Model instance $i_4$ has associated rules $r_2$ and $r_4$. Model instance $i_5$ has associated rules $r_5$, $r_7$, and $r_8$. Model instance $i_6$ has associated rule $r_6$. Model instance $i_7$ has associated rule $r_7$. Model instance $i_8$ has associated rule $r_8$. In FIG. 9, the model instances $i_1$ through $i_8$ have between one and three associated rules apiece.

It is understood, however, that a model instance can have any number of associated rules. Similarly, FIG. 9 shows eight model instances $i_1$ through $i_8$ and eight rules $r_1$ through $r_8$. It is understood, however, that the data base can contain as many model instances and as many rules as it has capacity to hold. The number of model instances and rules need not be the same.

In FIG. 9, the number in parenthesis to the right of each rule is the SIZEWIN value for that rule. Most commonly, the SIZEWIN value represents a number of model instances replaced by application of the rule. However, as discussed above, the SIZEWIN value for a rule can also be set to a predetermined value when the rule is defined. In FIG. 9, rule $r_1$ has a SIZEWIN value of "5". Rule $r_2$ has a SIZEWIN value of "3". Rule $r_3$ has a SIZEWIN value of "5". Rule $r_4$ has a SIZEWIN value of "2". Rule $r_5$ has a SIZEWIN value of "2". Rule $r_6$ has a SIZEWIN value of "5". Rule $r_7$ has a SIZEWIN value of "1". Rule $r_8$ has a SIZEWIN value of "4". In FIG. 9, the SIZEWIN values of rules $r_1$ through $r_8$ range between "1" and "5". It is understood, however, that SIZEWIN values may fall in any range appropriate for a specific embodiment of the present invention. For example, a logic synthesis system according to the present invention and incorporating a large number of rules may have SIZEWIN values between "0" and "5". Similarly, a logic synthesis system according to the present invention and incorporating some medium number of rules may have a large number of possible SIZEWIN values if it is desirable to have only a few instance-rule pairs in each SIZEWIN grouping.

FIG. 9 also shows SIZEWIN groupings of instance-rule pairs of the model instances $i_1$ through $i_8$. For example, model instance $i_1$ is paired with its associated TRUE rule with the highest SIZEWIN value, i.e., $r_5$, which has a SIZEWIN of "2". Therefore, the instance-rule pair $i_1$, $r_5$ is placed in SIZEWIN grouping 2. Note that, although rule $r_5$ evaluates to TRUE for model instance $i_1$, it does not evaluate to TRUE for model instance $i_5$. This result is included to show that one rule may be evaluated differently depending on the characteristics of the model instance with which it is associated. Because model instance $i_5$ does not have any associated rules that evaluate to TRUE, model instance i is not placed in a pair and is not placed in a SIZEWIN grouping Note also that, in FIG. 9, no instance-rule pairs are placed in SIZEWIN grouping 0 because no pairs are formed containing a rule with a SIZEWIN value of "0."

Figure 10:
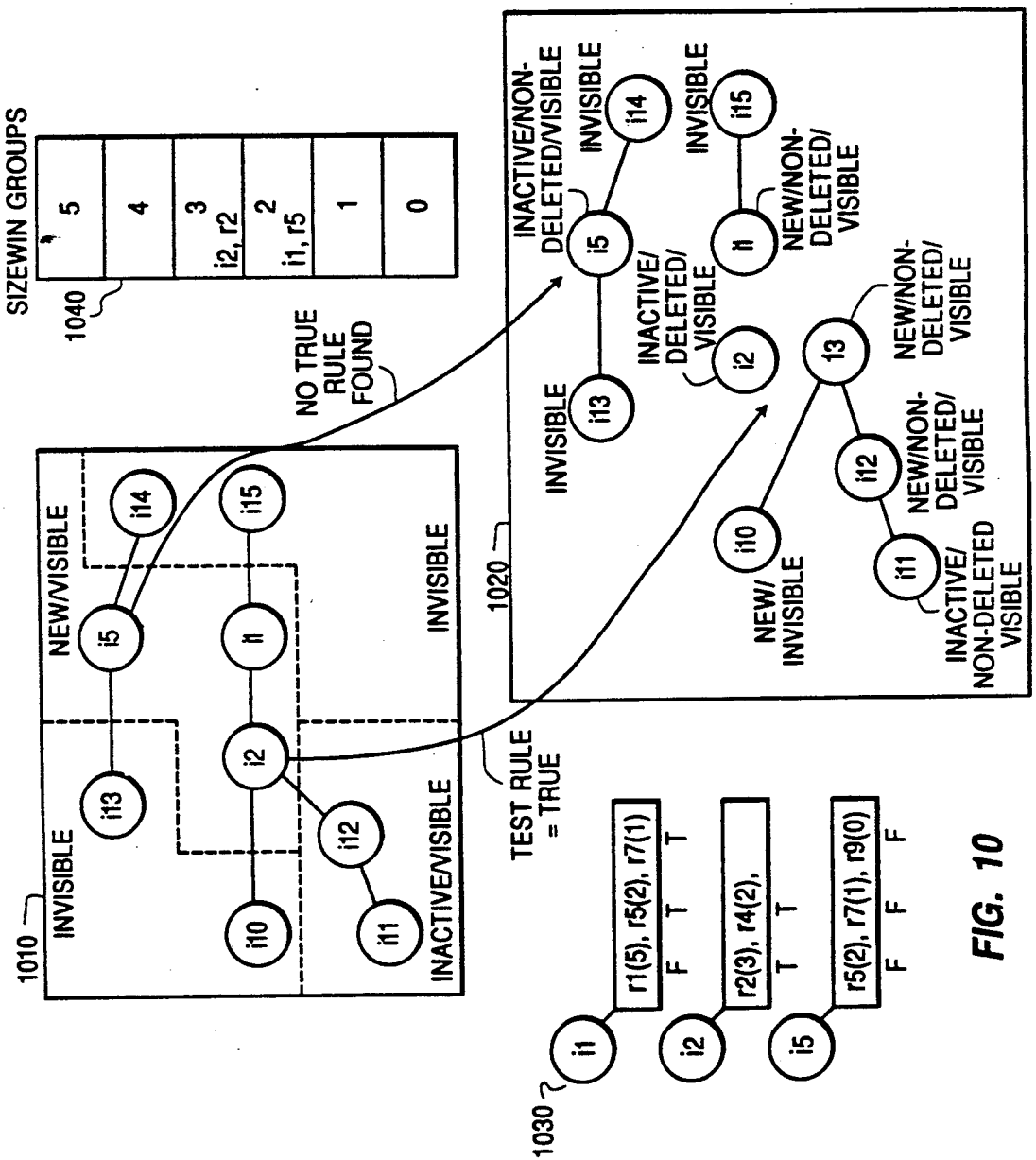
FIG. 10 is a diagram showing a result of FIGS. 6-9.

FIG. 10 is a diagram showing the operation of the first preferred embodiment of the present invention FIG. 10 shows a "before" view of a group of model instances 1010, an "after" view of a group of model instances 1020, examples of rules associated with certain model instances 1030, and instance-rule pairs grouped by SIZEWIN 1040.

The "before" view 1010 includes model instances $i_1$, $i_2$, $i_5$, $i_{10}$, $i_{11}$, $i_{12}$, $i_{13}$, $i_{14}$, and $i_{15}$. Model instances $i_{10}$, $i_{13}$, $i_{14}$, and $i_{15}$ are INVISIBLE (and, therefore, INACTIVE, although this is not shown in FIG. 10). Model instances $i_{11}$ and $i_{12}$ are VISIBLE and INACTIVE. Model instances $i_1$, $i_2$, and $i_5$ are VISIBLE and NEW.

Examples 1030 shows that model instance $i_1$ has associated rules $r_1$, $r_5$, and $r_7$. Model instance $i_2$ has associated rules $r_2$ and $r_4$, and model instance $i_5$ has associated rules $r_5$, $r_7$, and $r_9$. Rule $r_1$ has a SIZEWIN value of "5" and is FALSE for model instance $i_1$. Rule $r_2$ has a SIZEWIN value of "3" and is TRUE for model instance $i_2$. Rule $r_4$ has a SIZEWIN value of "2" and is TRUE for model instance $i_2$. Rule $r_5$ has a SIZEWIN value of "2" and is TRUE for model instance $i_1$ and FALSE for model instance $i_5$. Rule $r_7$ has a SIZEWIN value of "1" and is TRUE for model instance $i_1$ and FALSE for model instance $i_5$. Rule $r_9$ has a SIZEWIN value of "0" and is FALSE for model instance $i_5$.

The rule associated with model instance $i_1$ evaluating to TRUE and having the highest SIZEWIN value is rule $r_5$. Thus, model instance $i_1$ and rule $r_5$ form a instance-rule pair in SIZEWIN group 3 of table 1040. The rule associated with model instance $i_2$ evaluating to TRUE and having the highest SIZEWIN value is rule $r_2$. Thus, model instance $i_2$ and rule $r_2$ form a instance-rule pair in SIZEWIN group 2 of table 1040. Because no rule associated with model instance $i_5$ evaluates to TRUE, no rule-instance pair in entered in table 1040 for model instance $i_5$.

The "after" view 1020 shows the results after performing the steps of the flow chart of FIG. 8(a) for the instance-rule pairs of table 1040. Rule-instance pair $i_2$, $r_2$, which is in SIZEWIN group 3, is considered first. Neither rule $r_2$ nor rule $r_5$ is shown in FIG. 10. Referring to the steps of FIG. 8(a), model instance $i_2$ is not designated as DELETED and the antecedent portion of rule $r_2$ evaluates to TRUE. Therefore, the consequence portion of rule $r_2$ is performed for model instance $i_2$. The consequence portion causes model instance $i_2$ to be replaced by a new model instance $i_3$. Model instance $i_2$ is designated as DELETED, and model instances $i_1$, $i_{10}$, and $i_{12}$, which were previously connected to model instance $i_2$, are connected to model instance $i_3$. Model instance $i_3$ is designated as NEW, as are VISIBLE model instances $i_1$ and $i_{12}$ and INVISIBLE model instance $i_{10}$ connected to it.

The steps of FIG. 8(a) are similarly performed for instance-rule pair $i_1$, $r_5$. In the current example, these steps have no effect on the "after" view 1020. Assuming that the antecedent portion of rule $r_5$ refers to model instance $i_2$, step 802 is FALSE because model instance $i_2$ has been deleted previously, as described above. Therefore, the consequence portion of rule $r_5$ is not performed.

Model instance $i_5$ is designated as INACTIVE at the time that no associated TRUE rule is found. The steps of FIG. 8(a) are only performed for the instance-rule pairs in table 1040. Thus, the steps of FIG. 8(a) are not performed for model instance $i_5$.

In a second preferred embodiment of the present invention, model instances are also designated as SEMIACTIVE when no TRUE associated rule has been found for them once. The VISIBLE/INVISIBLE and DELETED/non-DELETED designations are the same as the designations described in connection with the first preferred embodiment. The NEW designation is also the same.

Figure 11:
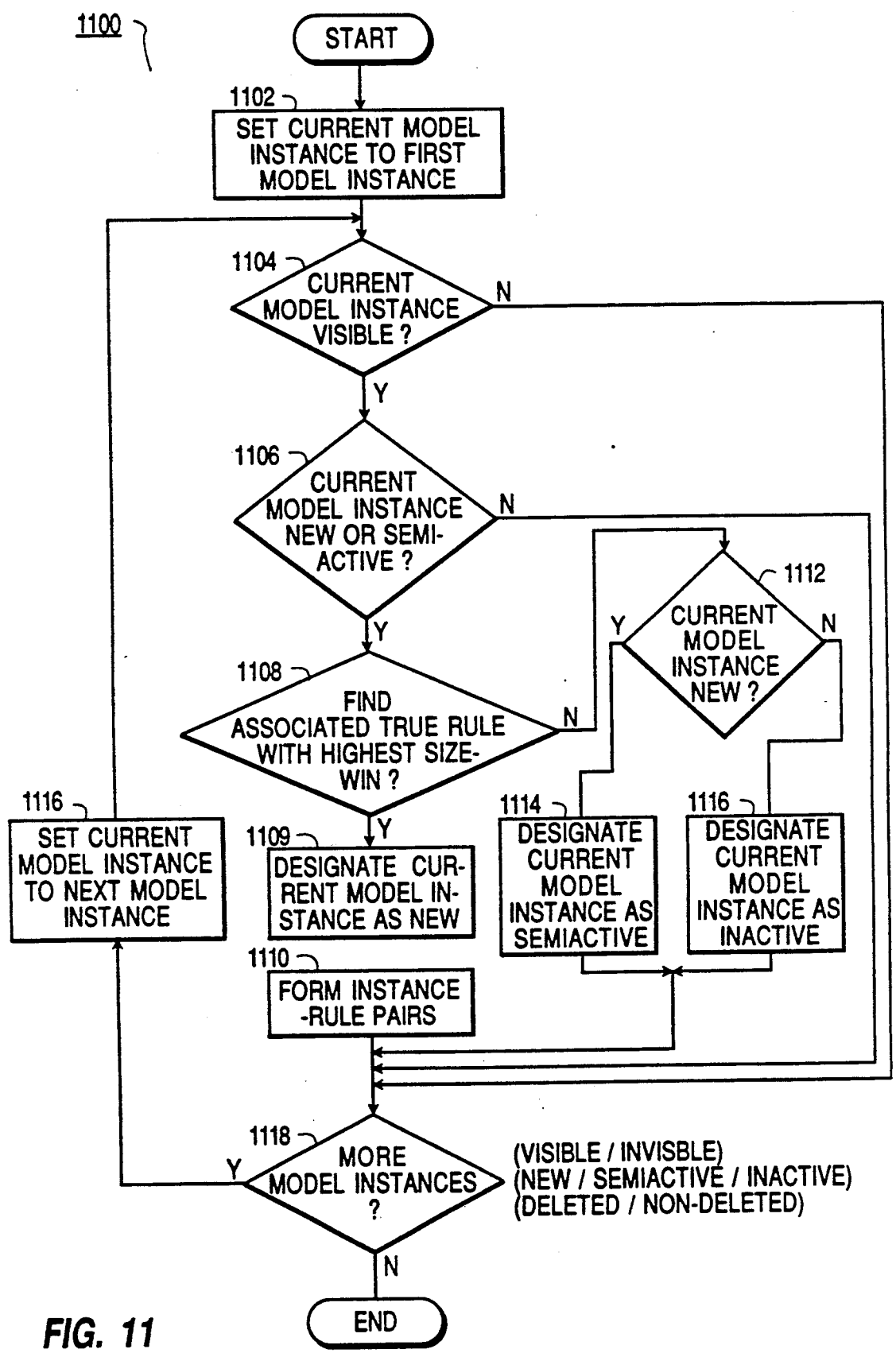
FIG. 11 is a flow chart further describing a method of selecting rules of FIG. 6 according to a second preferred embodiment of the present invention.

FIG. 11 is a flow chart 1100 showing step 604 of FIG. 6 in more detail for the second preferred embodiment. Thus, FIG. 11 shows how the instance-rule pairs for one iteration of the minor loop of FIG. 6 are determined in accordance with the present invention. Each model instance is paired with its associated rule that evaluates to TRUE and has the highest SIZEWIN value of all the TRUE rules associated with that model instance. The steps of flow chart 1100 are performed when a logic synthesis system incorporates the VISIBLE/INVISIBLE, NEW/SEMIACTIVE/INACTIVE and DELETED/non-DELETED designations. A person of ordinary skill in the art would understand, however, that similar steps are performed in systems lacking the VISIBLE/INVISIBLE designation.

Step 1102 establishes a first model instance as the "current model instance." Step 1104 determines if the current model instance has been designated as VISIBLE. If so, control passes to step 1106. If not, control passes to step 1118. Step 1106 determines if the current model instance has been designated NEW or SEMIACTIVE. If so, control passes to step 1108. If not, control passes to step 1118. Step 1108 determines whether the current model instance has at least one associated rule that evaluates to TRUE. If one or more TRUE rules with identical SIZEWIN value exist, step 1108 selects one of the rules. Otherwise step 1108 selects a TRUE associated rule with a highest SIZEWIN value. Step 1109 designates the current model instance as NEW. Step 1110 forms an instance-rule pair from the current model instance and the selected rule.

If no associated TRUE rules exist for the current model instance in step 1108, control passes to step 1112. If, in step 1112, it is determined that the current model instance is designated as NEW, the designation of the current model instance is changed to SEMIACTIVE in step 1114. If, alternately, in step 1112 it is determined that the current model instance is designated as SEMIACTIVE, the designation of the current model instance is changed to INACTIVE in step 1116.

Thus, steps 1109 and 1112 act together to ensure that a model instance will not be designated as INACTIVE until the system fails to find a TRUE associated rule twice in a row. A person skilled in the art would understand, however, that other preferred embodiments could require a higher number of failures to find a TRUE associated rule before designating the current model instance INACTIVE. In addition, other preferred embodiments could include additional levels of SEMIACTIVE designations, e.g., SEMIACTIVE1, SEMIACTIVE2, etc., that a model instance must have before being designated INACTIVE.

After both steps 1114 and 1116 of FIG. 11, control passes to step 1118. Step 1118 determines whether more model instances still need to be paired. If so, a new current model instance is selected in step 1120 and control returns to step 1104. Otherwise, the steps of FIG. 11 are completed.

Other preferred embodiments of the present invention employ various combinations of the VISIBLE/INVISIBLE, NEW/ACTIVE, and DELETED/non-DELETED designations and of the SIZEWIN values. For example, The VISIBLE/INVISIBLE designations could be employed in a logic circuit synthesis system that does not employ SIZEWIN groupings, or the DELETED/non-DELETED designations could be employed in a system that does not employ SIZEWIN groupings.

Figure 12:
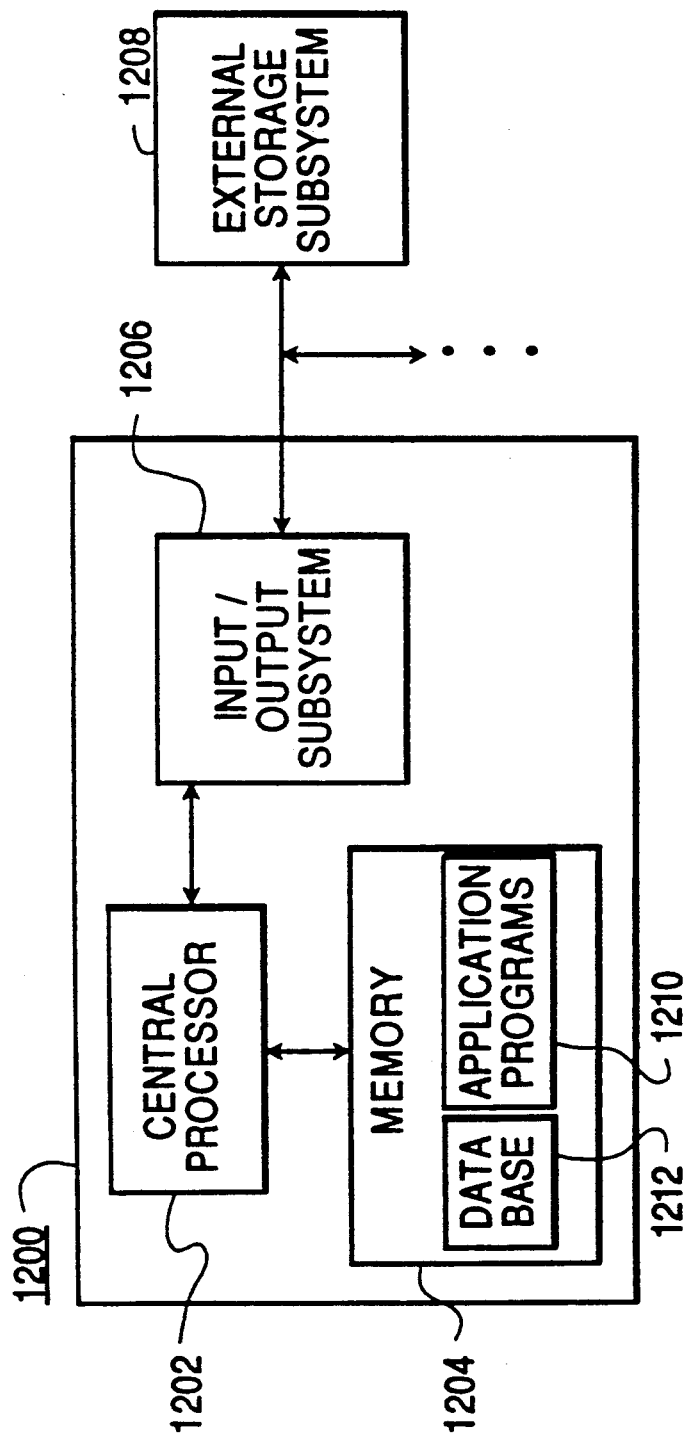
FIG. 12 is a block diagram of a computer system which constitutes a preferred embodiment of the invention.

FIG. 12 shows a computer system 1200 which constitutes a preferred embodiment of the invention. System 1200 is a VAX 6850 system commercially available from the Digital Equipment Corporation. System 1200 includes a central process 1202, a memory 1204 connected to central processor 1202, an input/output (I/O) subsystem 1206 connected to central processor 1202, and an external storage subsystem 1208 connected to I/O subsystem 1206. The methods set forth in the flow charts of FIGS. 6-11 are identified as application programs 1210, which are written in the LISP computer language, stored in memory 1204, and performed by central processor 1202. Computer system 1200 preferably operates under the VMS operating system. Memory 1204 also stores the database 1212 of the present invention, including the model definitions, model instances, and rules for the current rule base. Central processor uses I/O subsystem 1206 to input data base entries and to output the final technology representation from memory 1204. Rules bases and LIBRARY data not used for a particular run of the logic synthesis system are preferably stored offline in external storage subsystem 1208. It will be apparent to persons skilled in the art that other computer systems and components could be used.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A process of synthesizing a circuit design by replacing a first set of model instances stored in the data base and representing the circuit design with a second set of model instances stored in the data base and representing specific logic components of the circuit design by application of a set of rules to the first set of model instances and by altering parameter values of objects in the data base by application of the set of rules, each of the rules having an antecedent portion and a consequence portion, the method comprising the steps of:

storing the set of rules in the data base, subsets of the rules being associated with model instances in the first set of model instances, each associated rule capable of being applied to replace at least one model instance in the first set with at least one new model instance in the second set or of altering parameter value of an object in the data base, and each rule having an associated SIZEWIN value representing a figure of merit;

assigning an associated rule to at least one of the model instances in the first set to provide a set of instance-rule pairs;

arranging the set of instance-rule pairs into groups according to the SIZEWIN values of the rules of the pairs; and applying a consequence portion of respective ones of the rules of the instance-rule pairs by group to ones of the model instances when an antecedent portion of respective ones of the rules is TRUE.

2. The process of claim 1, wherein the step of applying the rules of the instance-rule pairs by group further includes:

applying the rules of a group including rules having the largest SIZEWIN value first; and applying the rules of a group including rules having the smallest SIZEWIN value last.

3. The process of claim 1, wherein the step of storing the set of rules in the data base further includes the step of:

assigning a predetermined SIZEWIN value to at least one rule, wherein the predetermined SIZEWIN value represents a relative importance of the rule in comparison to the other rules.

4. The process of claim 1, wherein the step of storing the rules in the data base further includes the step of:
assigning a predetermined SIZEWIN value to at least one rule, wherein the predetermined SIZEWIN value represents the number of model instances that the rule is capable of replacing.

5. The process of claim 1, wherein the step of assigning an associated rule to at least one of the model instances of the first set further includes the step of assigning an associated rule having the highest SIZEWIN value.

6. The process of claim 1, wherein each of the rules evaluates to one of TRUE and FALSE for each model instance with which it is associated, and
wherein the step of assigning an associated rule to at least one of the model instances of the first set includes the step of assigning an associated rule when the rule evaluates to TRUE for the at least one model instance with which the rule is associated.

7. The process of claim 1, wherein the steps of assigning, arranging, and applying form a minor loop and the process further includes the step of iteratively performing the minor loop until no rules were assigned in the assigning step of a previous iteration.

8. The process of claim 7, further including the step of iteratively performing the testing and performing steps until all the rules of the set of instance-rule pairs have been tested.

9. The process of claim 1, wherein a rule includes an antecedent portion containing a test and a consequence portion containing an action and wherein the applying step further includes the steps of:
testing the antecedent portion of one of the assigned rules; and
performing the consequence portion of the assigned rule when the testing step determines that the antecedent portion evaluates to TRUE and when the model instance paired with the rule has not been replaced.

10. The process of claim 9, wherein the antecedent portion of a rule refers to a plurality of model instances, and wherein the performing step further includes the step of performing the consequence portion of the assigned rule when the antecedent portion of the assigned rule does not refer to model instances that have been replaced.

11. The process of claim 10, wherein a replaced model instance is designated as DELETED, and wherein the performing step of claim 10 further includes the step of performing the consequence portion of the assigned rule when the antecedent portion of the assigned rule does not refer to model instances that are designed as DELETED.

12. The process of claim 9, wherein a replaced model instance is designated as DELETED, and wherein the performing step further includes the step of performing the consequence portion of the assigned rule when the testing step determines that the antecedent portion evaluates to TRUE and when the model instance paired with the rule is not designated as DELETED.

13. A process of synthesizing a circuit design by replacing a first set of model instances stored in a data base and representing the circuit design with a second set of model instances stored in the data base and representing specific logic components of the circuit design by application of a set of rules to the first set of model instances, each of the rules having an antecedent portion and a consequence portion, the method comprising the steps of:
storing the set of rules in the data base, subsets of the rules being associated with model instances in the first set of model instances, each associated rule capable of being applied to replace at least one model instance in the first set with at least one new model instance in the second set or of altering a parameter value of an object in the data base;
designating ones of the first set of model instances as VISIBLE; and
applying a consequence portion of ones of the subsets of rules associated with the VISIBLE model instances in the first set of model instances to replace ones of the first set of model instances with model instances in the second set when an antecedent portion of respective ones of the rules is TRUE.

14. The process of claim 13, wherein the designating step further includes the steps of:
designating other ones of the first set of model instances as INVISIBLE; and
declining to apply the subsets of rules associated with the INVISIBLE model instances.

15. The process of claim 14, wherein the step of applying ones of the subsets of rules associated with the VISIBLE model instances further includes the steps of applying ones of the subsets of rules associated with the VISIBLE model instances to replace ones of the first set of model instances, wherein the replaced model instances include INVISIBLE model instances.

16. A process of synthesizing a circuit design by replacing a first set of model instances stored in a data base and representing the circuit design with a second set of model instanced stored in the data base and representing specific logic components of the circuit design by application of a set of rules to the first set of model instances and by altering parameter values of objects in the data base by application of the set of rules, each of the rules including an antecedent portion and a consequence portion, the method comprising the steps of:
storing the set of rules in the data base, subsets of the rules being associated with model instances in the first set of model instances, each associated rule capable of being applied to replace at least one model instance in the first set with at least one new model instance in the second set or of altering a parameter value of an object in the data base;
assigning an associated rule to at least one of the model instances in the first set to provide a set of instance-rule pairs, wherein performance of the assigning step results in other model instances of the first set lacking an assigned rule;
applying the consequence portion of one of the rules of the instance-rule pairs to ones of the model instances when the antecedent portion of respective ones of the rules is TRUE; and
designating as INACTIVE the model instances lacking an assigned rule.

17. The process of claim 16, further including the step of initially designating each model instance in the first set as NEW.

18. The process of claim 17, wherein the assigning step further includes the step of assigning an associated rule only to NEW model instances in the first set to provide a set of instance-rule pairs, thus causing model instances lacking an assigned rule.

19. The process of claim 18, wherein the steps of assigning, applying, and designating of claim 18 are performed in a plurality of iterations, and wherein the step of designating as INACTIVE further includes the step of designating as INACTIVE a model instance that has lacked an associated rule during at least two successive iterations.

20. The process of claim 19, wherein the step of designating as INACTIVE further includes the step of designating as SEMIACTIVE a model instance that has lacked an assigned rule during a single iteration.

21. The process of claim 18, further including the steps of:
designating as NEW all model instances directly connected to a model instance replacing a current model instance.

22. An apparatus for synthesizing a circuit design by replacing a first set of model instances stored in a data base and representing the circuit design with a second set of model instances stored in the data base and representing specific logic components of the circuit design by application of a set of rules to the first set of model instances and by altering parameter values of objects in the data base by application of the set of rules, the rules including an antecedent portion and a consequence portion, the apparatus comprising:
means for storing the set of rules in the data base, subsets of the rules being associated with model instances in the first set of model instances, each associated rule capable of being applied to replace at least one model instance in the first set with at least one new model instance in the second set or to alter a parameter value of an object in the data base, and each rule having an associated SIZEWIN value representing a figure of merit;
means for assigning an associated rule to at least one of the model instances in the first set to provide a set of instance-rule pairs;
means for arranging the set of instance-rule pairs into groups according to the SIZEWIN values of the rules of the pairs; and
means for applying a consequence portion of the rules of the instance-rule pairs by group to replace model instances of the first set of model instances of the second set when the antecedent portion of respective ones of the rules is TRUE.

23. The apparatus of claim 22, wherein the means for storing the set of rules in the data base further includes:
means for assigning a predetermined SIZEWIN value to at least one rule, wherein the predetermined SIZEWIN value represents a relative importance of the rule in comparison to the other rules.

24. The apparatus of claim 23, wherein the means for applying the rules of the instance-rule pairs by group further includes:
means for applying the rules of a group including rules having the largest SIZEWIN value first; and
means for applying the rules of a group including rules having the smallest SIZEWIN value last.

25. The apparatus of claim 22, wherein the means for storing the set of rules in the data base further includes:
means for assigning a predetermined SIZEWIN value to at least one rule, wherein the predetermined SIZEWIN value represents the number of model instances that the rule is capable of replacing.

26. The apparatus of claim 22, wherein the means for assigning an associated rule to at least one of the model instances of the first set further includes means for assigning an associated rule having the highest SIZEWIN value.

27. The apparatus of claim 22, wherein each of the rules evaluates to one of TRUE and FALSE for each model instance with which it is associated, and
wherein the means for assigning an associated rule to at least one of the model instances of the first set includes means for assigning an associated rule when the rule evaluates to TRUE for the at least one model instance with which the rule is associated.

28. The apparatus of claim 22, wherein the means for assigning, means for arranging, and means for applying perform their respective functions in iteration forming a minor loop and wherein the apparatus further includes means for ceasing performance of the minor loop when no rules were assigned by the means for assigning in a most recent iteration of the minor loop.

29. The apparatus of claim 28, further including means for ceasing performance of the testing and performing steps when all the rules of the set of instance-rule pairs have been tested.

30. The apparatus of claim 22, wherein a rule includes an antecedent portion containing a test and a consequence portion containing an action and wherein the means for applying further includes:
means for testing the antecedent portion of one of the assigned rules; and
means for performing the consequence portion of the assigned rule when the means for testing step determines that the antecedent portion evaluates to TRUE and when the model instance paired with the rule has not been replaced.

31. The apparatus of claim 30, wherein the antecedent portion of a rule refers to a plurality of model instances, and wherein the means for performing further includes means for performing the consequence portion of the assigned rule when the antecedent portion of the assigned rule does not refer to model instances that have been replaced.

32. The apparatus of claim 31, wherein a replaced model instance is designated as DELETED, and wherein the means for performing of claim 31 further includes means for performing the consequence portion of the assigned rule when the antecedent portion of the assigned rule does not refer to model instances that are designated as DELETED.

33. The apparatus of claim 30, wherein a replaced model instance is designated as DELETED, and wherein the means for performing further includes means for performing the consequence portion of the assigned rule when the means for testing determines that the antecedent portion evaluates to TRUE and when the model instance paired with the rule is not designated as DELETED.

34. An apparatus for synthesizing a circuit design by replacing a first set of model instances stored in a data base and representing the circuit design with a second set of model instances stored in the data base and representing specific logic components of the circuit design by application of a set of rules to the first set of model instances and by altering parameter values of objects in the data base by application of the set of rules, each of the rules including an antecedent portion and a consequence portion, the apparatus comprising:
means for storing a set of rules in the data base, subsets of the rules being associated with model instances in the first set of model instances, each associated rule capable of being applied to replace at least one model instance in the first set with at least one new model instance in the second set or to alter a parameter value of an object in the data base;

means for designating ones of the first set of model instances as VISIBLE; and means for applying a consequence portion of ones of the subsets of rules associated with the VISIBLE model instances in the first set of model instances to replace ones of the first set of model instances with model instances in the second set when the antecedent portion of respective ones of the rules is TRUE.

35. The apparatus of claim 34, wherein the means for designating further includes:

means for designating other ones of the first set of model instances as INVISIBLE; and means for declining to apply the subsets of rules associated with the INVISIBLE model instances.

36. The apparatus of claim 35, wherein the means for applying ones of the subsets of rules associated with the VISIBLE model instances further includes means for applying ones of the subsets of rules associated with the VISIBLE model instances to replace ones of the first set of model instances, wherein the replaced model instances include INVISIBLE model instances.

37. An apparatus for synthesizing a circuit design by replacing a first set of model instances stored in a data base and representing the circuit design with a second set of model instances stored in the data base and representing specific logic components of the circuit design by application of a set of rules to the first set of model instances and by altering parameter values of objects in the data base by application of the set of rules, each of the rules including an antecedent portion and a consequence portion, the apparatus comprising:

means for storing the set of rules in the data base, subsets of the rules being associated with model instances in the first set of model instances, each associated rule capable of being applied to replace at least one model instance in the first set with at least one new model instance in the second set or to alter a parameter value of an object in the data base;

means for assigning an associated rule to at least one of the model instances in the first set to provide a set of instance-rule pairs, wherein performance of the assigning step results in other model instances of the first set lacking an assigned rule;

means for applying a consequence portion of ones of the rules of the instance-rule pairs to ones of the model instances when the antecedent portion of respective ones of the rules is TRUE; and means for designating as INACTIVE the model instances lacking an assigned rule.

38. The apparatus of claim 37, further including means for initially designating each model instance in the first set as NEW.

39. The apparatus of claim 38, wherein the means for assigning further includes means for assigning an associated rule only to NEW model instances in the first set to provide a set of instance-rule pairs, thus causing model instances lacking an assigned rule.

40. The apparatus of claim 39, wherein the steps of assigning, applying, and designating of claim 39 are performed in a plurality of iterations, and wherein the means for designating model instances as INACTIVE further includes means for designating as INACTIVE a model instance that has lacked an associated rule during at least two successive iterations.

41. The apparatus of claim 40 wherein the means for designating model instances as INACTIVE further includes means for designating as SEMIACTIVE a model instance that has lacked an assigned rule during a single iteration.

42. The apparatus of claim 39, further including:

means for designating as NEW all model instances directly connected to a model instance replacing a current model instance.

* * * * *

UNITED STATES PATENT AND TRADEMARK OFFICE
CERTIFICATE OF CORRECTION

PATENT NO. : 5,095,441

DATED : March 10, 1992

INVENTOR(S) : Donald F. Hooper et al.

It is certified that error appears in the above-identified patent and that said Letters Patent is hereby corrected as shown below:

Title page,
item [75], Inventors, change "Donald F. Hopper" to -- Donald F. Hooper --;

Abstract, line 7, change "INVISIBLE," to --INVISIBLE.--;

Abstract, line 11, change "assciated" to -- associated --;

Claim 1, column 16, line 27, after "in" change "the" to -- a --;

Claim 11, column 17, line 54, change "designed" to -- designated --;

Claim 15, column 18, line 26, change "steps" to -- step --;

Claim 16, column 18, line 34, change "instanced" to -- instances --;

Claim 37, column 21, line 36, change "including" to -- having --.

Signed and Sealed this

Twenty-fourth Day of August, 1993

Attest:

BRUCE LEHMAN

*Attesting Officer*　　　*Commissioner of Patents and Trademarks*